United States Patent
Lachartre

(10) Patent No.: US 11,720,066 B2
(45) Date of Patent: Aug. 8, 2023

(54) TIME-TO-DIGITAL CONVERTER AND PHASE-LOCKED LOOP

(71) Applicant: Commissariat à l'Energie Atomique et aux Energies Alternatives, Paris (FR)

(72) Inventor: David Lachartre, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 17/931,970

(22) Filed: Sep. 14, 2022

(65) Prior Publication Data
US 2023/0102825 A1    Mar. 30, 2023

(30) Foreign Application Priority Data
Sep. 24, 2021  (FR) ...................................... 2110080

(51) Int. Cl.
*G04F 10/00*   (2006.01)
*H03L 7/093*   (2006.01)
*H03M 3/00*    (2006.01)

(52) U.S. Cl.
CPC ............ *G04F 10/005* (2013.01); *H03L 7/093* (2013.01); *H03L 2207/50* (2013.01); *H03M 3/458* (2013.01)

(58) Field of Classification Search
CPC .......................... G04F 10/005; H03L 2207/50; H03L 2207/00
See application file for complete search history.

(56) References Cited

U.S. PATENT DOCUMENTS

| | | | |
|---|---|---|---|
| 7,570,182 B2 * | 8/2009 | Sheba ................... | G04F 10/005 341/118 |
| 10,763,869 B2 * | 9/2020 | Khoury ..................... | H03L 7/16 |
| 10,831,159 B2 * | 11/2020 | Khoury ................ | G04F 10/005 |
| 2017/0194972 A1 | 7/2017 | Sai et al. | |

OTHER PUBLICATIONS

Rezvanyvardom, Mahdi, and Ebrahim Farshidi. "A novel cyclic time-to-digital converter based on triple-slope interpolation and time amplification." Radioengineering 24, No. 3 (2015): 800-807.
(Continued)

*Primary Examiner* — Diana J. Cheng
(74) *Attorney, Agent, or Firm* — Moreno IP Law LLC

(57) ABSTRACT

The present description concerns a converter comprising: a circuit (C1) supplying a first pulse (P1) determined by an interval between an active edge of a first signal (S1) and an active edge of a second signal (S2); a circuit (INT) which, at each first pulse (P1), integrates the first pulse (P1), a second pulse (P2) starting after the first pulse (P1) in synchronism with a clock signal (clk), and a third pulse (P3) starting after the third pulse (P3) in synchronism with the clock signal (clk); a circuit (C3) sampling over one bit (OUT1) an output signal (RES1) of the integrator circuit (INT) at the beginning of each third pulse (P3); and two circuits (C2, C4) generating, for each first pulse (P1), respectively the corresponding second pulse and the third corresponding pulse based on the first bit (OUT1).

13 Claims, 10 Drawing Sheets

(56) References Cited

OTHER PUBLICATIONS

Dayanik, Mehmet Batuhan, Nicholas Collins, and Michael P. Flynn. "A 28.5-33.5 GHz fractional-N PLL using a 3 rd order noise shaping time-to-digital converter with 176fs resolution." In ESSCIRC Conference 2015—41st European Solid-State Circuits Conference (ESSCIRC), pp. 376-379. IEEE, 2015.

Wang, Zixuan, Cheng Huang, and Jianhui Wu. "An ADPLL with a MASH 1-1-1 ΔΣ Time-digital converter." MELECON 2014-2014 17th IEEE Mediterranean Electrotechnical Conference. IEEE, 2014.

Cao, Ying, et al. "1-1-1 MASH $\Delta\Sigma$ Time-to-Digital Converters With 6 ps Resolution and Third-Order Noise-Shaping" IEEE Journal of Solid-State Circuits 47.9 (2012): 2093-2106.

Gande, Manideep, et al. "A 71dB dynamic range third-order ΔΣ TDC using charge-pump." 2012 Symposium on VLSI Circuits (VLSIC). IEEE, 2012.

Preliminary Search Report for French Application No. 2110080 dated Apr. 29, 2022, 1 page.

\* cited by examiner

TIME-TO-DIGITAL CONVERTER AND PHASE-LOCKED LOOP

FIELD

The present disclosure generally concerns electronic circuits, and more particularly converters of a time period into a digital signal representative of said time period, or time-to-digital converters, and phase-locked loops comprising such time-to-digital converters.

BACKGROUND

Time-to-digital converters are known. These converters are configured to convert a time period into a digital signal representative of the value of this time period.

For example, a known time-to-digital converter comprises a succession of stages forming a delay line. The state of each stage of the delay line is sampled at each active edge of a converter timing signal. Further, the delay line receives as input an edge of a first signal, which propagates in the delay line. At the next active edge of the timing signal, the sampled state of the delay line is then representative of a duration separating the delivery of the edge of the first signal of the delay line from the next active edge of the timing signal. A disadvantage of such a time-to-digital converter, called flash time-to-digital converter, is that the accuracy of measurement of the time period separating the edge of the first signal from the next active edge of the timing signal is limited by the propagation time of a stage of the converter. Such a converter also requires a calibration of the propagation time in each stage of the converter, so that each stage introduces the same delay. Further, when such a converter is implemented in an all digital phase-locked loop (ADPLL), it is generally necessary to perform a normalization of the converter output, which implies additional non-desirable processing.

SUMMARY

There is a need to overcome all or part of the disadvantages of known time-to-digital converters.

For example, there is a need to overcome all or part of the disadvantages of known time-to-digital converters intended for an implementation in an all digital phase-locked loop.

For example, there is a need for a time-to-digital converter which, when it is implemented in an all digital phase-locked loop, supplies an output in the form of a normalized phase shift.

For example, there is a need for a time-to-digital converter which, when it is implemented in an all digital phase-locked loop, requires no clock signal other than the clock signals respectively received and supplied by the phase-locked loop.

For example, there is a need for a time-to-digital converter which is simple and compact to implement.

For example, there is a need for a time-to-digital converter which, when it is implemented in an all digital phase-locked loop, takes advantage of the low-pass filtering implemented in the loop.

For example, there is a need for a time-to-digital converter which is more particularly adapted to an implementation in an all digital phase-locked loop, and which can also be used in any other application or electronic system where a time-to-digital conversion is required.

An embodiment overcomes all or part of the disadvantages of known time-to-digital converters, for example when they are implemented in an all digital phase-locked loop.

An embodiment provides a time-to-digital converter comprising:
a first circuit configured to deliver, at each active edge of a first signal, a first pulse of duration determined by an interval between said active edge of the first signal and an immediately successive active edge of a second signal; and
an integrator circuit configured, at each first pulse, to integrate:
  the first pulse,
  a second pulse starting after the first pulse and in synchronism with a clock signal, and
  a third pulse starting after the second pulse and in synchronism with the clock signal,
a second circuit configured to generate, for each first pulse, the corresponding second pulse;
a third circuit configured to quantize over one bit an output signal of the integrator circuit and, at the beginning of each third pulse, store over a first bit said binary quantization; and
a fourth circuit configured to generate, for each first pulse, the third corresponding pulse based on the first bit.

According to an embodiment, the second circuit is configured to receive the clock signal, and to generate, at least partly based on the clock signal, at least one third signal configured to control the storages by the third circuit and the generations of the third pulses by the fourth circuit.

According to an embodiment, the first circuit is configured to supply a fourth signal indicating a beginning and an end of each first pulse, the second circuit being configured to receive the fourth signal and to generate the third signal based on the clock signal and on the fourth signal.

According to an embodiment, the first and second circuits are configured so that the second pulses place a conversion zero of the converter in the middle of the dynamic range of the converter.

According to an embodiment, the fourth circuit is configured so that the integration of each third pulse implements a subtraction of the binary quantization stored at the beginning of said third pulse.

According to an embodiment, the first and second circuits are configured so that each second pulse causes, on the output signal of the integrator circuit, a variation of identical amplitude and of a sign opposite to an amplitude variation that would be caused by a first pulse of duration determined by half the dynamic range of the converter.

According to an embodiment, the converter is of sigma-delta type and the fourth circuit is configured so that each third pulse implements a sigma-delta negative feedback.

According to an embodiment:
the first, second, and third pulses are signed;
the first and second circuits are configured so that a sign of the second pulses is opposite to a sign of the first pulses and that a maximum duration of the first pulses that the converter can convert multiplied by an amplitude of the first pulses is equal to twice a duration of the second pulses multiplied by an amplitude of the second pulses; and
the fourth circuit is configured so that a sign of each third pulse is determined by a state of the first bit and that an amplitude of the third pulses multiplied by a duration of the third pulses is equal to the duration of the second pulses multiplied by the amplitude of the second pulses.

According to an embodiment, the second and third pulses each have a duration which is a multiple of a period of the clock signal, preferably equal to one period of the clock signal.

According to an embodiment, an output of said converter is at least partly determined by the first bit.

According to an embodiment, the converter is of sigma-delta multi-stage noise shaping type, the converter comprising a first stage comprising the integrator circuit and the first, second, third, and fourth circuits, and a second stage configured to receive an output signal of the integrator circuit of the first stage and to supply a digital output signal of the second stage based on the output signal of the integrator circuit of the first stage, an output of said converter being at least partly determined by the first bit and the digital output signal of the second stage.

According to an embodiment, the second stage is configured to:
generate, after each third pulse, a fourth pulse starting in synchronism with the clock signal;
integrate, during each fourth pulse, a sum of the output signal of the integrator circuit of the first stage and of a feedback signal, quantize over one bit a result of said integration and store over a second bit said binary quantization at the end of the fourth pulse;
generate, during each third pulse, a fifth pulse based on the second bit, and the feedback signal by integrating said fifth pulse; and
store the second bit over a third bit at each active edge of the first signal, the digital output signal of the second stage being generated based on the second and third bits or corresponding to the second and third bits.

According to an embodiment, the second stage comprises:
a fifth circuit configured to generate, after each third pulse, a fourth pulse starting in synchronism with the clock signal;
an integrator circuit configured to integrate, during each fourth pulse, a sum of the output signal of the integrator circuit of the first stage and of a feedback signal;
a sixth circuit configured to quantize over one bit an output the integrator circuit of the second stage and store said binary quantization over a second bit at the end of each fourth pulse;
a seventh circuit configured, at each third pulse, to supply said feedback signal by integrating, during said third pulse, a fifth pulse determined based on the second bit; and
a circuit configured to store the second bit over a third bit at each active edge of the first signal, the digital output signal of the second stage being generated based on the second and third bits or corresponding to the second and third bits.

According to an embodiment, the converter comprises a first input configured to receive the first signal and a second input configured to receive the clock signal, and:
the second signal and the clock signal are one and the same, or
the converter comprises a circuit for dividing the frequency, preferably by two, configured to receive the clock signal and to supply the second signal.

Another embodiment provides an all digital phase-locked loop configured to receive a signal at a first frequency and to supply a signal at a second frequency equal to N/D times the first frequency, N and D being two positive values, the phase-locked loop comprising a converter such as described hereabove, the first input of the converter being configured to receive the signal at the first frequency and the second input of the converter being configured to receive the signal at the second frequency.

According to an embodiment, the phase-locked loop comprises
a circuit configured to supply a first digital signal incremented by value N at the first frequency;
a circuit configured to supply a second digital signal incremented by value D at the second frequency and a third digital signal corresponding to a storage of the second digital signal clocked at the first frequency;
a digital filter configured to receive a subtraction of an output of the converter and of the third digital signal to the first digital signal and to control an oscillator configured to deliver the signal at the second frequency,
wherein the second signal of the converter is one and the same with the signal at the second frequency.

According to an embodiment, the phase-locked loop comprises:
either a circuit configured to supply a first digital signal incremented by value N at the first frequency, and a circuit configured to supply a second digital signal incremented by value D/2 at the second frequency, D being even, or a circuit configured to supply a first digital signal incremented by value 2N at the first frequency and a circuit configured to supply a second digital signal incremented by value D at the second frequency;
a circuit configured to supply a third digital signal corresponding to a storage of the second digital signal clocked by the second digital signal of the converter;
a digital filter configured to receive a subtraction of an output of the converter and of the third digital signal to the first digital signal and to control an oscillator configured to supply the signal at the second frequency,
the second signal of the converter being obtained by dividing by two the frequency of the signal at the second frequency.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION OF THE PRESENT EMBODIMENTS

Figure 1:
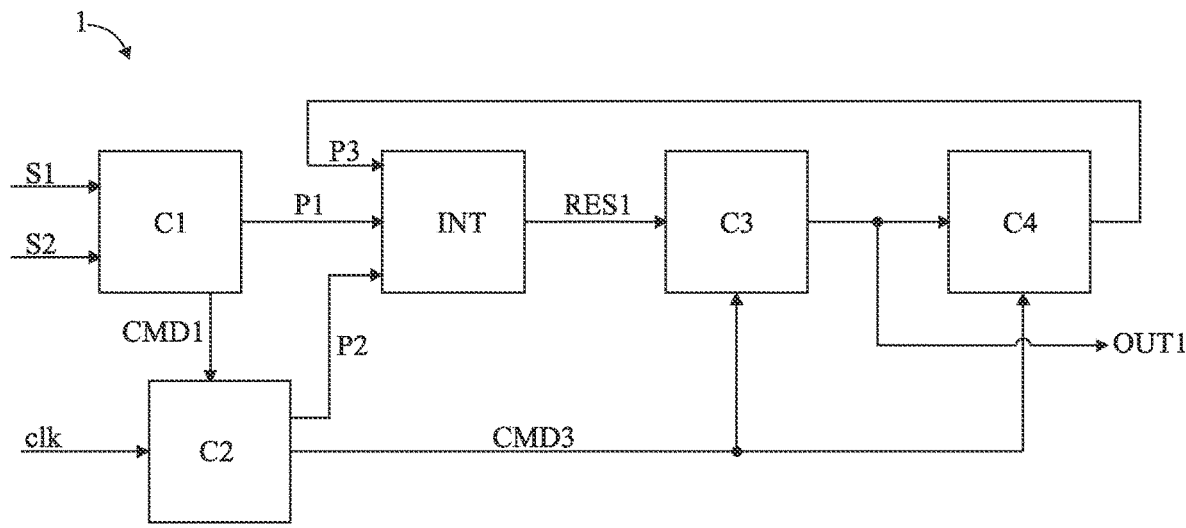
FIG. 1 schematically shows in the form of functional blocks an embodiment of a time-to-digital converter.

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

In the present application, unless specified otherwise, one calls "pulse", for example, a square-shaped variation of the level of a signal with respect to an initial or idle state, also called zero level, of the signal. Unless specified otherwise, one calls "amplitude of a pulse", for example, the absolute value of the level of the signal during the pulse with respect to its zero level, that is, the absolute value of the level of the pulse, it being understood that a pulse may have a negative or positive level with respect to the zero of the signal. A pulse with a negative level will be called "negative pulse" and a pulse with a positive level will be called "positive pulse". For example, a negative pulse of amplitude A corresponds to a pulse of level equal to −A and a positive pulse of amplitude A corresponds to a pulse of level equal to +A.

Unless indicated otherwise, one calls "dynamic range" of the time-to-digital converter, for example, the difference between the largest value and the smallest value that the converter can measure.

A sigma-delta type time-to-digital converter is here provided to measure a time period between each active edge of a first signal and an active edge of a second signal following the active edge of the first signal.

According to an embodiment, at each active edge of the first signal, the converter is configured to successively integrate, with an integrator circuit, a first pulse representative of the time period to be measured, a second pulse configured to center an output dynamic range of the integrator circuit, and a third pulse configured to implement the negative feedback of the sigma-delta loop, the converter being further configured to quantize and store over one bit an output of the integrator circuit, for example, at the beginning of each third pulse.

In other words, each second pulse is configured to cause a variation of the output signal of the integrator of identical amplitude and of a sign opposite to a variation of the output signal of the integrator caused by a first pulse corresponding to a time period to be measured equal to half the dynamic range of the converter. Still in other words, the second pulses are configured to place the conversion zero of the converter in the middle of the dynamic range of the converter.

For example, the converter is configured so that a sign of the first pulses is opposite to that of the second pulses and so that a maximum duration of the first pulses that the converter can convert multiplied by an amplitude of the first pulses is equal to twice a duration of the second pulses multiplied by an amplitude of the second pulses.

Further, in other words, each third pulse is for example configured to subtract at the input of the integrator circuit the stored result of the quantization of the output of the integrator circuit performed at the beginning of the third pulse, so that after the integration of the third pulse, the output of the integrator circuit then only comprises the residual quantization error.

For example, the converter is configured so that the sign of each third pulse is determined by the state of the bit corresponding to the storage of the quantization of the output of the integrator circuit, and so that an amplitude of the third pulses multiplied by a duration of the third pulses is equal to the amplitude of the second pulses multiplied by the duration of the second pulses.

Still in other words, there is here provided a sigma-delta type time-to-digital converter operating, at each conversion cycle, according to at least three phases successively comprising a first phase during which the time period to be converted is integrated, a second phase during which a conversion zero is centered in the middle of the dynamic range of the converter, and a third phase during which the sigma-delta negative feedback is implemented.

FIG. 1 very schematically shows in the form of functional blocks an embodiment of a time-to-digital converter 1 of sigma-delta type.

Converter 1 comprises a first circuit C1. Circuit C1 is configured to supply, at each active edge, for example at each rising edge, of a signal S10, a pulse P1. The duration of pulse P1 is determined by an interval between the active edge of signal S1 and an immediately successive active edge, for example, a rising edge, of a signal S2. In other words, circuit C1 is configured to supply, at each rising edge of signal S1, a pulse P1 having a duration representative of the time separating this edge of signal S1 from the next active edge of signal S2. Each pulse P1 is for example a pulse starting during an active edge of signal S1 and ending at the immediately following active edge of signal S2.

In the rest of the disclosure, call Dmax the maximum duration of the pulses P1 that the converter can convert. As an example, a pulse P1 having a duration Dmax corresponds to a time period to be measured equal to the maximum time period that the converter can measure, that is, to the maximum interval between an active edge of signal S1 and a next active edge of signal S2 that the converter can measure.

In the following description, it is considered as an example that pulses P1 all have a duration shorter than or equal to Dmax, or, in other words, that the time periods to be measured with converter 1 are all comprised within the dynamic range of the converter.

According to an embodiment, converter 1 is configured to convert the time period between each active edge of signal S1 and an immediately successive active edge of signal S2 into a digital output signal of converter 1.

As an example, circuit C1 is configured to receive signals S1 and S2 and to supply pulses P1.

According to an embodiment, at each rising edge of signal S1, circuit C1 is configured to generate a signal or pulse CMD1. The duration of pulse CMD1 is determined by the time period between the edge of signal S1 and the immediately successive edge of signal S2. The duration of pulse CMD1 determines the duration of pulse P1 or, in other words, pulse P1 is determined based on pulse CMD1. In other words, each pulse CMD1 indicates the beginning of a corresponding pulse P1 and the end of this pulse P1. Each pulse CMD1 is for example a pulse starting during an active edge of signal S1 and ending at the immediately following rising edge of signal S2. Each pulse P1 is for example a pulse starting at the same time as a corresponding pulse CMD1, and ending at the same time as this pulse CMD1.

As an example, circuit C2 comprises a flip-flop, not shown in FIG. 1, receiving signals S1 and S2 on two of its inputs and supplying pulses CMD1. Preferably, the flip-flop is an RS flip-flop having a set input, that is, input S of the flip-flop, configured to receive signal S1, having its reset input, that is, input R of the flip-flop, configured to receive signal S2, and having an output, for example, output Q of the flip-flop, configured to supply signal CMD1. Preferably, the S, respectively R, input of the flip-flop is sensitive to the active edges of signal S1, respectively S2. Of course, those skilled in the art are capable of replacing this flip-flop with any other circuit enabling to generate, based on signals S1 and S2, pulses CMD1. For example, those skilled in the art are capable of replacing the RS flip-flop of circuit C1 with a D-type flip-flop, or with a circuit other than a flip-flop.

Converter 1 further comprises an integrator circuit INT. Circuit INT is configured to integrate pulses that it receives, and to supply an output signal RES1 corresponding to the result of this integration. More particularly, at each first pulse P1, circuit INT is configured to integrate pulse P1, and then a pulse P2 corresponding to, or associated with, this pulse P1, and then a pulse P3 corresponding to, or associated with, this pulse P1.

For each pulse P1, the associated pulse P2 starts after pulse P1, in synchronism with a clock signal clk, and the associated pulse P3 starts after pulse P2, also in synchronism with signal clk. As an example, pulses P2 and P3 start in synchronism with the rising edges of signal clk. According to another example, pulses P2 and P3 start in synchronism with the falling edges of signal clk. According to an embodiment, pulses P2 and P3 each have durations which are multiples, preferably, integer, of a period of signal clk, for example durations equal to a period of signal clk.

According to an embodiment, the frequency of signal clk is sufficiently large for the conversion by the converter of a time period triggered by an active edge of signal S1 to be ended before the beginning of the next conversion caused by the next edge of signal S1. For example, a multiplicative factor between the frequency of signal clk and that of signal S1 is determined so that, after each active edge of signal S1, converter 1 performs an update of its output before a new active edge of signal S1 occurs. The determination of this multiplicative factor is within the abilities of those skilled in the art.

A circuit C2 of converter 1 is configured to generate, for each pulse P1, the corresponding pulse P2. As an example, circuit C2 is configured to receive signals clk and CMD1, and to supply the corresponding pulses P2. As an example, circuit C2 is configured to generate pulses P2 based on signals clk and CMD1.

Circuit C2 is configured so that pulses P2 center an output dynamic range of integrator INT. In other words, circuits C2 and C1 are configured so that each pulse P1 causes a variation of signal RES1 of identical amplitude and having a sign opposite to a variation of signal RES1 caused by a pulse P1 corresponding to a time period to be measured equal to half the dynamic range of the converter. Still in other words, circuits C2 and C1 are configured so that the second pulses place the conversion zero of the converter in the middle of the dynamic range of the converter, that is, so that second pulses P2 generate, during their integrations by circuit INT, a shift or bias which places the zero of the conversion dynamics in the middle of the maximum time period that converter 1 can measure.

Call A1 the amplitude of pulse P1, A2 the amplitude of pulses P2, and K2*Tclk the duration of pulses P2, A1 and A2 being positive real values, K2 a positive non-zero integer, and Tclk the duration of a period of signal clk.

According to an embodiment, pulses P1 and P2 are signed. Circuits C1 and C2 are then configured so that pulses P1 and P2 are of opposite sign and that the product of the maximum duration Dmax of pulses P1 by the amplitude A1 of pulses P1 is equal to twice the product of the duration K2*Tclk of pulses P2 by the amplitude A2 of pulses P2. In other words, circuits C1 and C2 are configured so that pulses P1 and P2 are of opposite signal and that Dmax*A1=2*K2*Tclk*A2. As an example, pulses P1 are positive and thus each have a level equal to A1 and pulse P2 are negative and thus each have a level equal to −A2. As an example, when A1=2*A2 and K2=1, then the duration Dmax of pulses P1 is equal to Tclk. In such an example, if each pulse P1 starts during an active edge of signal S1 and ends during the next active edge of signal S2, then the maximum time period that the converter can measure between each active edge of signal S1 and the next active edge of signal S2 is equal to Dmax.

The present disclosure is not limited to the above example, and those skilled in the art are capable of providing other values of K2, A1, and A2 allowing the above-described operation.

A circuit C3 of converter 1 is configured to quantize over one bit the output signal RES1 of integrator circuit INT, and to store, at the beginning of each pulse P3, this binary quantization of signal RES1 over one bit OUT1.

According to an embodiment, circuit C3 is configured to supply a bit comp1 corresponding to the binary quantization of signal RES1, and to update bit OUT1 based on bit comp1 at the beginning of each pulse P3. More particularly, circuit C3 is configured to compare signal RES1 with a level ref, preferably equal to half the output dynamic range of circuit INT, and to supply bit comp1 in a first binary state when signal RES1 is greater than reference level ref, and in a second binary state when signal RES1 is smaller than reference level ref. For example, the first binary state of signal comp1 corresponds to a high level of signal comp1, and the second binary state of signal comp1 corresponds to a low level of signal comp1. As an example, level or potential ref is equal to half the difference between a high power supply level Vdd and a low power supply potential, for example, the ground or Vss=−Vdd, of converter 1.

According to an embodiment, the storages implemented by circuit C3, that is, the updates of the state of the output bit OUT1 of circuit C3, are controlled by a signal, or pulses, CMD3. Signal CMD3 has active edges synchronized with, or simultaneous to, the beginnings of pulses P3. For example, each pulse P3 starts at the same time as an active edge of signal CMD3 or, in other words, at the same time as a pulse CMD3. Preferably, the durations of pulses CMD3 and of pulses P3 are equal. As an example, pulses P3 are determined based on signal CMD3, or, in other words, signal CMD3 controls the generation or the supply of pulses P3. As an example, circuit C3 comprises a flip-flop, for example, of type D, which samples the result of the binary quantization comp1 of signal RES1 with respect to level ref at each beginning of a pulse P3, for example, at each beginning of a pulse CMD3, and which outputs bit OUT1.

According to an embodiment, circuit C2 is configured to supply signal CMD3. According to an embodiment, circuit C2 is configured to supply signal CMD3 at least partly based on signal clk. According to an embodiment, circuit C2 is configured to supply signal CMD3 based on signal clk and based on signal CMD1.

A circuit C4 of converter 1 is configured to generate, for each pulse P1, the corresponding pulse P3 based on bit OUT1.

According to an embodiment, circuit C4 is configured so that the integration of each pulse P3 implements a subtraction of the binary quantization stored at the beginning of this third pulse P3. To say it in more detailed fashion, circuit C4 is configured so that, for each pulse P1, the integration of the associated pulse P3 by circuit INT corresponds to a subtraction, on signal RES1, of the binary quantization stored at the beginning of pulse P3 by circuit C3. Still in other words, circuit C4 is configured so that each pulse P3 implements the sigma-delta negative feedback, that is, the sigma-delta type negative feedback implemented in converter 1.

According to an embodiment, circuit C4 is configured to generate pulses P3 based on bit OUT1 and based on signal CMD3. In other words, the supply of pulses P3 is controlled by signal CMD3.

According to an embodiment, pulses P3 are signed like pulses P1 and P2. The sign of each pulse P3 is then determined by the value (or state) of bit OUT2. As an example, when bit OUT2 is in a first binary state, pulse P3 then has a negative level equal to −A3, and, when bit OUT2 is in a second binary state, pulse P3 then has a positive level equal to +A3. A3 is a positive real value corresponding to the amplitude of each pulse P3 and being identical for all pulses P3. Due to the fact that each pulse P3 has an amplitude equal to A3, signal P3 has a peak-to-peak amplitude equal to 2*A3.

Call K3*Tclk the duration of pulses P3, K3 being a positive and non-zero integer. According to an embodiment, circuit C4 is configured so that the product of the duration K3*Tclk of pulses P3 by the amplitude A3 of pulses P3 is equal to the product of the duration K2*Tclk of pulses P2 by the amplitude A2 of pulses P2. In other words, circuit C4 is configured so that K3*A3=K2*A2.

The above-described converter 1 is particularly simple and compact to implement.

Further, converter 1 requires no calibration phase, conversely to many known time-to-digital converters.

In sigma-delta type converter 1, the quantization is implemented over a single bit. This results in a better conversion linearity than if the quantization had been implemented over a plurality of bits. Although a quantization over a single bit generates a large quantization error in the form of a high quantization noise, converter 1 is of sigma-delta type and thus has the property of displacing this quantization noise towards high frequencies, so that the low-frequency noise density will be decreased while the high-frequency noise density will be increased. Thus, by applying a digital low-pass filtering to the output of converter 1, a large portion of the quantization noise, for example, more than 99% of the quantization noise, is removed and the signal-to-noise ratio of the useful signal is improved, for example by 40 dB. In the example illustrated in FIG. 1, signal OUT1 corresponds to the output signal of the converter. The implementation of a digital low-pass filtering, for example clocked by the frequency of signal S1, of this output signal OUT1 then provides a binary word indicating the value of the duration measured with less quantization noise than bit OUT1.

According to an embodiment where converter 1 is implemented in an all digital phase-locked loop, the digital low-pass filtering of signal OUT1 is implemented by the digital filter of the phase-locked loop, it being understood that the output signal of converter 1 may be combined with other digital signals before being supplied to the filter. In such an embodiment, converter 1 takes advantage of the digital low-pass filtering already present in the all digital phase-locked loop.

According to an embodiment where converter 1 is implemented in an all digital phase-locked loop, signal clk corresponds to the periodic output signal of the phase-locked loop, signal S1 corresponds to the periodic input signal of the phase-locked loop, and signal S2 is obtained from signal clk. Thus, the converter requires no other clock or timing signals than those available at the input and at the output of the phase-locked loop.

According to an embodiment where converter 1 is implemented in an all digital phase-locked loop, converter 1 directly supplies a normalized phase interval, without requiring an additional calculation.

Figure 2:
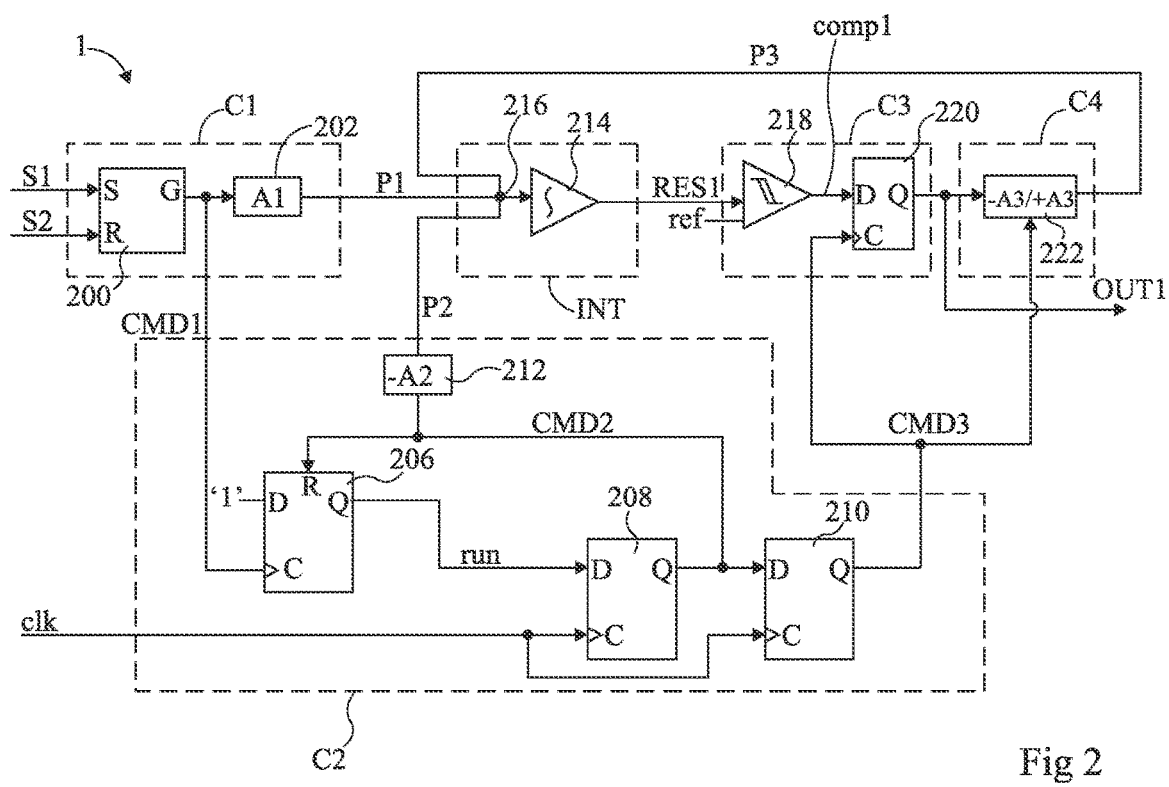
FIG. 2 schematically shows details of an example of embodiment of the time-to-digital converter of FIG. 1.

FIG. 2 schematically shows details of an example of embodiment of the converter 1 of FIG. 1.

In this example, the active edges of signals S1 and S2 are the rising edges of these signals, it being understood that those skilled in the art are capable of adapting the description made hereafter to the case where the active edges of one and/or the other of signals S1 and S2 are falling edges.

Further, in this example, the level of pulses P1 is equal to +A1, the level of pulses P2 is equal to −A2, and K2 and K3 are each equal to 1. Thus, the amplitude A3 of pulses P3 is equal to the amplitude A2 of pulses P2 and, further, Dmax=2*A2/A1*Tclk.

In the example of FIG. 2, circuit C1 comprises a flip-flop 200. Flip-flop 200 is configured so that a rising edge of signal S1 causes the setting to the high state of signal CMD1 and the next edge of signal S2 causes the setting back to the low state of signal CMD1. In other words, flip-flop 200 is configured so that a rising edge of signal S1 causes the beginning of a corresponding pulse CDMD1 and that the next edge of signal S2 causes the end of this pulse CMD1. As an example, flip-flop 200 is an RS-type flip-flop having an input S (set input) receiving signal S1, an input R (reset input) receiving signal S2, and an output Q supplying pulses CMD1.

In the example of FIG. 2, circuit C1 also comprises a circuit 202 (block "A1" in FIG. 2). Circuit 202 is configured to receive pulses CMD1 and supply the corresponding pulses P1. In other words, circuit C1 is configured to supply pulses P1 of amplitude A1 based on signal CMD1. As an example, circuit 202 comprises one or a plurality of resistive elements and/or a switch controlled by signal CMD1.

In the example of FIG. 2, circuit C2 is configured to generate, after each pulse CMD1, a pulse P2 starting at the same time as an active edge, for example, rising, of signal clk, and to generate, after each pulse P2, a pulse CMD3 starting at the same time as an active edge, for example, rising, of signal clk. Circuit C2 is configured so that the duration of each of pulses P2 is equal to K2*Tclk and that the duration of each of pulses CMD3 is equal to K3*Tclk, K2 and K3 being each equal to 1 in this example.

As an example, as illustrated in FIG. 2, circuit C2 comprises three flip-flops 206, 208, and 210. Flip-flop 206 is configured to supply, based on signal CMD1, a signal run indicating for each pulse CMD1 whether the pulse has ended or not. Flip-flop 208 is configured to supply a signal CMD2 determining the beginning and the end of each pulse P2 based on signal run and based on signal clk. Flip-flop 210 is configured to supply signal CMD3 based on signal CMD2 and based on signal clk. Circuit C2 further comprises a circuit 212 (block "−A2") configured to supply pulses P2 based on signal CMD2, each pulse P2 having an amplitude A2.

As an example, flip-flop 206 is a D-type flip-flop having a data input D receiving a high level ('1' in FIG. 2), for example, the power supply potential Vdd of converter 1, a clock (or synchronization) input C active on a falling edge and receiving signal CMD1, a reset input R active on a high level and receiving signal CMD2, and an output Q supplying signal run.

As an example, flip-flop 208 is a D-type flip-flop having a data input D receiving signal run, a clock input C receiving signal clk and being sensitive, or active, on the active edges of signal clk, and an output Q supplying signal CMD2.

As an example, flip-flop 210 is a D-type flip-flop having a data input D receiving signal CMD2, a clock input C receiving signal clk and being sensitive, or active, on the active edges of signal clk, and an output Q supplying signal CMD3.

Circuit 212 is configured to receive pulses CMD2 and to supply the corresponding pulses P2. In this example, pulses P1 are positive and each have a level equal to A1, pulses P2 then being negative and thus each having a level equal to −A2. As an example, circuit 212 comprises one or a plurality of resistive elements and/or a switch controlled by signal CMD2.

In the example of FIG. 2, circuit INT comprises an operational amplifier 214 assembled as an integrator, which integrator assembly of operational amplifier 214 is not detailed in FIG. 2. Amplifier 214 comprises a first input coupled, preferably connected, to a node 216 configured to receive pulses P1, P2, and P3. An output of amplifier 214 supplies signal RES1.

As an example, as illustrated in FIG. 2, circuit C3 may comprise a comparator 218, for example, implemented from an operational amplifier. Comparator 218 has an input receiving signal RES1, another input receiving the level ref having signal RES1 compared therewith, and an output supplying a binary signal comp1 in a first state, for example, the high state, when signal RES1 is greater than level ref and in a second state, for example, the low state, when signal RES1 is smaller than level ref. Signal comp1 corresponds to the quantization over one bit, or binary quantization, of signal RES1. Circuit C3 may then also comprise, as illustrated in FIG. 2, a storage element 220 clocked by signal CMD3. Element 220 is configured to supply bit OUT1 based on bit comp1, for example, to update the state of bit OUT1 based on the state of bit comp1 at each beginning of a pulse CMD3. In other words, element 220 is configured to sample bit comp1, for example, at each rising or falling edge of signal CMD3, and to store on bit OUT1 the sampled level of bit comp1. As an example, flip-flop 220 is a D-type flip-flop having a data input D receiving signal comp1, a clock input C receiving signal CMD3 and being active on the rising edges of signal CMD3, and an output Q supplying signal OUT1.

In the example of FIG. 2, circuit C4 corresponds to a circuit 222 (block "−A3/+A3" in FIG. 2). Circuit 222 receives signal OUT1 and signal CMD3 and supplies the corresponding pulses P3. As an example, circuit 222 comprises one or a plurality of resistive elements and/or a switch controlled by signal CMD3.

The case where a positive, respectively negative, pulse P1, P2, or P3 at the input of integrator 214 causes an increase, respectively a decrease, of signal RES1, is considered as an example. In this example, after each update of bit OUT1, circuit 222 supplies a negative pulse P3 of amplitude A3 when bit OUT1 is in a binary state indicating that signal RES1 is greater than level ref and a positive pulse P3 of amplitude A3 when bit OUT1 is in a binary state indicating that signal RES1 is smaller than level ref. In other words, after each update of bit OUT1, circuit 222 supplies a pulse P3 of level equal to −A3 when bit OUT1 indicates that signal RES1 is greater than level ref, and of level equal to +A3 when bit OUT1 indicates that signal RES1 is smaller than level ref.

Those skilled in the art will be capable of deducing from the above example the polarity of pulses P3 according to the state of bit OUT1 in the case where a positive, respectively negative, pulse P1, P2, or P3 at the input of integrator 214 causes a decrease, respectively an increase, of signal RES1.

Figure 3:
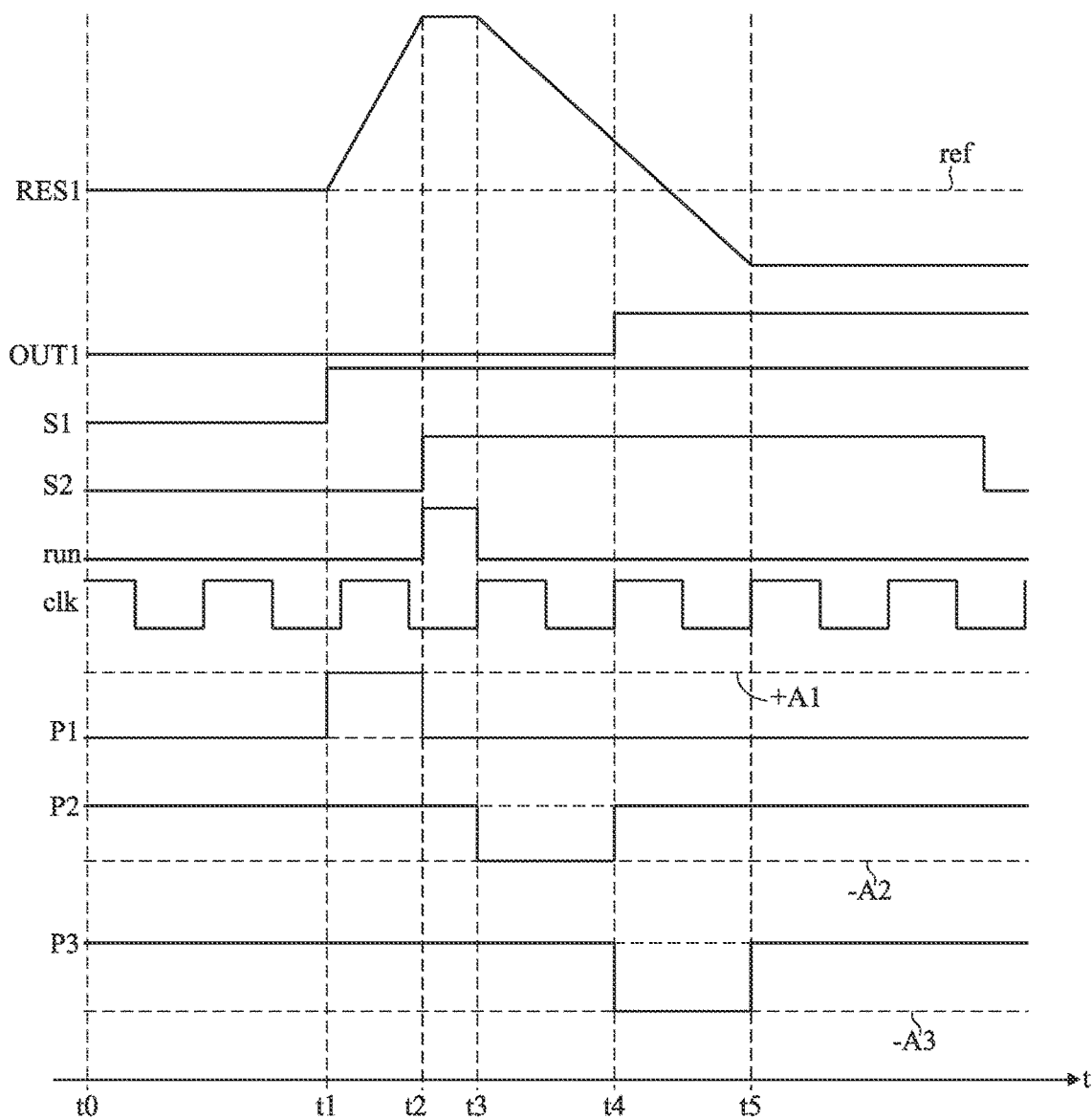
FIG. 3 illustrates in timing diagrams the operation of the converter of FIG. 2.

FIG. 3 illustrates, in timing diagrams, an example of operation of the converter 1 of FIG. 1 when it is implemented as described in relation with FIG. 2. In the example of FIGS. 3, K2 and K3 are each equal to 1, and amplitudes A2 and A3 are equal to 0.5 time amplitude A1, although those skilled in the art are capable of adapting the above description to the case where K2, K3, A1, A2, and A3 have other values. In this example, a positive, respectively negative, pulse P1, P2, or P3 at the input of integrator 214 causes an increase, respectively a decrease, of signal RES1, and, further, bit OUT1 is updated in the high, respectively low, state, when at the time of this update, signal RES1 is greater, respectively smaller, than level ref.

As an example, at a time t0, the output RES1 of circuit INT and signals P1, P2, and P3 are at their zero level, signals S1 and S2, run, and OUT being in the low state.

FIG. 3 illustrates a single operating cycle of converter 1, that is, the succession of steps repeated after each active edge of signal S1.

At a time t1 subsequent to time t0, signal S1 switches to the high state. The rising edge of signal S1 causes that signal CMD1 (not shown in FIG. 3) switches to the high state and that signal P1 switches to level +A1. In other words, the rising edge of signal S1 causes the beginning of a pulse CMD1 and of a pulse P1.

From time t1, due to the fact that circuit INT receives positive pulse P1, signal RES1 varies, in this example increases, with a slope proportional to the level of pulse P1, each pulse P1 here having a level equal to +A1.

At a time t2 subsequent to time t1, signal S2 switches to the high state. The rising edge of signal S2 results in that signal CMD1 (not shown in FIG. 3) switches to the low state and in that signal P1 recovers its zero level. In other words, the rising edge of signal S2 causes the end of pulses CMD1 and P1. As a result, signal RES1 stops varying and stores its value at time t2.

Further, the end of pulse CMD1 (not shown in FIG. 3), that is, the falling edge of signal CMD1 received by flip-flop 206, causes the switching to the high state of signal run.

A time t3 subsequent to time t2 corresponds to the first rising edge of signal clk following the end of pulse P1. This rising edge of signal clk causes the switching to the high state of signal CMD2 (not shown in FIG. 3) and to level −A2 of signal P2. In other words, this edge of signal clk causes the beginning of a pulse CMD2 and of a pulse P2. Further, the beginning of pulse CMD2 causes the switching to the low state of signal run.

From time t3, due to the fact that circuit INT receives negative pulse P2, signal RES1 varies, in this example decreases, with a slope proportional to the level of pulse P2, each pulse P2 here having a level equal to −A2.

A time t4 subsequent to time t3 corresponds to the next rising edge of signal clk. This rising edge of signal clk results in that signal CMD2 (not shown in FIG. 3) switches to the low state and in that signal P2 recovers its zero level. In other words, the rising edge of signal clk causes the end of pulses CMD2 and P2. Further, this rising edge of signal clk causes the switching to the high state of signal CMD3 (not illustrated in FIG. 3) and thus the update of bit OUT1 and the beginning of a pulse P3.

In this example, during its update at time t4, bit OUT1 switches to the high state due to the fact that signal RES1 is greater than level ref at time t4.

In this example, the high state of bit OUT1 thus results in a negative pulse P3 of amplitude A3, that is, a pulse of level equal to −A3, and the low state of bit OUT1 results in a positive pulse P3 of amplitude A3, that is, a pulse of level equal to +A3. Thus, in this example, the pulse P3 starting at time t4 has a level equal to −A3 since bit OUT1 is in the high state.

From time t4, due to the fact that circuit INT receives pulse P3, signal RES1 varies with a slope proportional to the level of pulse P3. More particularly, in this example, signal RES1 decreases with a slope proportional to the negative level −A3 of pulse P3.

A time t5 subsequent to time t4 corresponds to the next rising edge of signal clk. This rising edge of signal clk causes the switching to the high state of signal CMD3, and thus the end of pulse P3, that is, the return to the zero level of signal P3.

Further, from time t5, as long as circuit INT receives no further pulse P1, P2, or P3, signal RES1 stores, or keeps, its value at time t5.

After time t5, each new rising edge of signal S1 causes a new operating cycle of converter 1, that is, a new succession of pulses P1, P2, and P3, a modification of signal RES1 based on its current value, and an update of bit OUT1 based on signal RES1.

Figure 4:
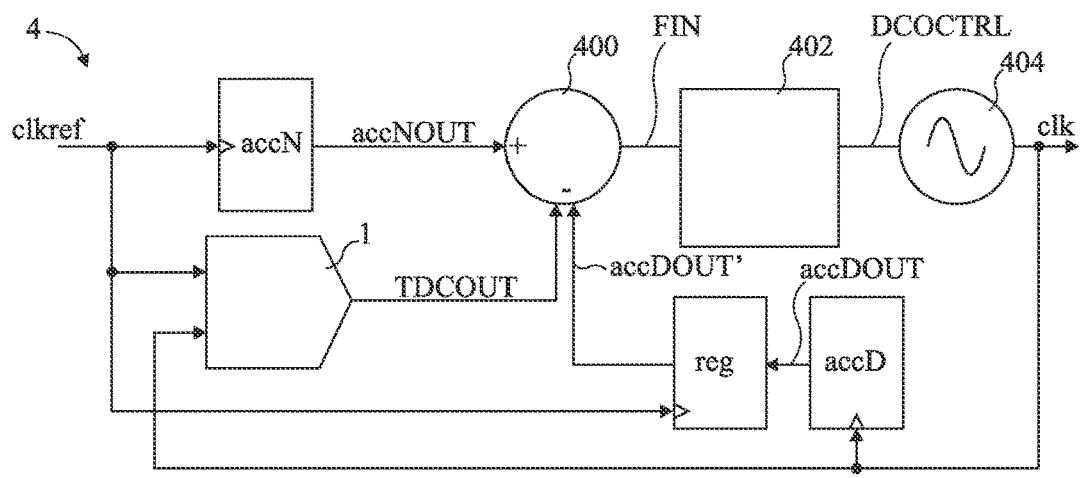
FIG. 4 schematically shows in the form of blocks an embodiment of an all digital phase-locked loop.

FIG. 4 illustrates an example of an all digital phase-locked loop 4, according to an embodiment, where phase-locked loop 4 comprises converter 1.

Phase-locked loop 4 is configured to receive a signal clkref at a first frequency and to supply signal clk at a second frequency equal to N/D times the first frequency, N and D being two positive values. Preferably, D is greater than or equal to 1, and N is greater than 1 and in general than D.

Phase-locked loop 4 comprises converter 1. Converter 1 comprises an input configured to receive signal clkref, which then corresponds to the signal S1 described in relation with FIGS. 1 and 2, and a second input configured to receive signal clk. In the example of embodiment illustrated in FIG. 4, the signals S2 (see FIGS. 1 and 2) and clk of converter 1 are one and the same.

Converter 1 delivers an output signal TDCOUT. When converter 1 is of the type described in relation with FIG. 1 or FIG. 2, signal TDCOUT is for example equal to bit OUT.

In FIG. 4, phase-locked loop 4 comprises a circuit accN, a circuit accD, a register reg, a digital arithmetic circuit 400, a digital low-pass filter 402, and a digital control oscillator 404.

Circuit accN is configured to supply a digital signal accNOUT incremented by value N at the frequency of signal clkref. In other words, at each rising edge of signal clkref, signal accNOUT is incremented by value N. Still in other words, signal accNOUT represents the accumulated phase of signal clkref.

Circuit accD is configured to supply a digital signal accDOUT incremented by value D at the frequency of signal clk. In other words, at each rising edge of signal clk, signal accDOUT is incremented by value D.

Circuit reg is configured to sample signal accDOUT in synchronism with signal clkref, for example, in synchronism with the active edges of signal clkref, and to supply a signal accDOUT' corresponding to the storage of this sampling. In other words, circuit ref copies signal accDOUT on its output accDOUT' at each active edge of signal clkref. Still in other words, signal accDOUT' represents the accumulated phase of signal clk sampled by clkref.

Circuits accD and reg thus form a circuit configured to supply signal accDOUT incremented by value D at the frequency of signal clk and signal accDOUT' corresponding to the sampling by signal clkref of signal accDOUT. In other words, circuits accD and reg form a circuit configured to supply the signal accDOUT' corresponding to the sampling, by signal clkref, of signal accDOUT incremented by value D at the frequency of signal clk.

Digital filter 402, in practice a low-pass filter, is configured to receive and filter a result FIN of a subtraction of the output signal TDCOUT of converter 1 and of signal accDOUT' from signal accNOUT, and to control oscillator 404. Thus, circuit 400 is configured to receive signals TDCOUT, accNOUT, and accDOUT' and to supply, at the input of filter 402, the digital signal FIN corresponding to the digital signal accNOUT from which digital signals TDCOUT and accDOUT' have been subtracted.

Filter 402 supplies a digital control signal DCOCTRL to oscillator 404. Signal DCOCTRL corresponds to the result of the low pass filtering of signal FIN by filter 402. As an example, the z transfer function of filter 402 may be of type $a+(b/(1-z^{-1}))$.

Oscillator 404 is configured to supply signal clk at a frequency determined by the output value of filter 402, that is, by the value of signal DCOCTRL.

In phase-locked loop 4, the subtraction of signal accDOUT' from signal accNOUT represents the phase-locked loop error, tainted by a residual phase error PhiError between the frequency of signal clkref and that of signal clk. This error PhiError is in practice equal to the ratio of a value DeltaT to a period Tclk of signal clk, DeltaT being the time period separating each edge of signal clkref from the next edge of signal clk. The provision of converter 1 and the subtraction of signal TDCOUT from the result of the subtraction of signal accDOUT' from signal accNOUT enables to suppress the residual phase error PhiError in the signal FIN representative of the phase error of loop 4.

Although this is not illustrated herein, converter 1 may be implemented in all digital phase-locked loops different from those of FIG. 4. For example, converter 1 may be implemented in an all digital phase-locked loop which does not comprise circuits accN, accD, reg, and 400, where the output TDCOUT of converter 1 is directly supplied to filter 402, converter 1 receives signal clkref or a signal obtained by a division by D of the frequency of signal clk and signal clk or a signal obtained by a division by N of the frequency of signal clk.

Figure 5:
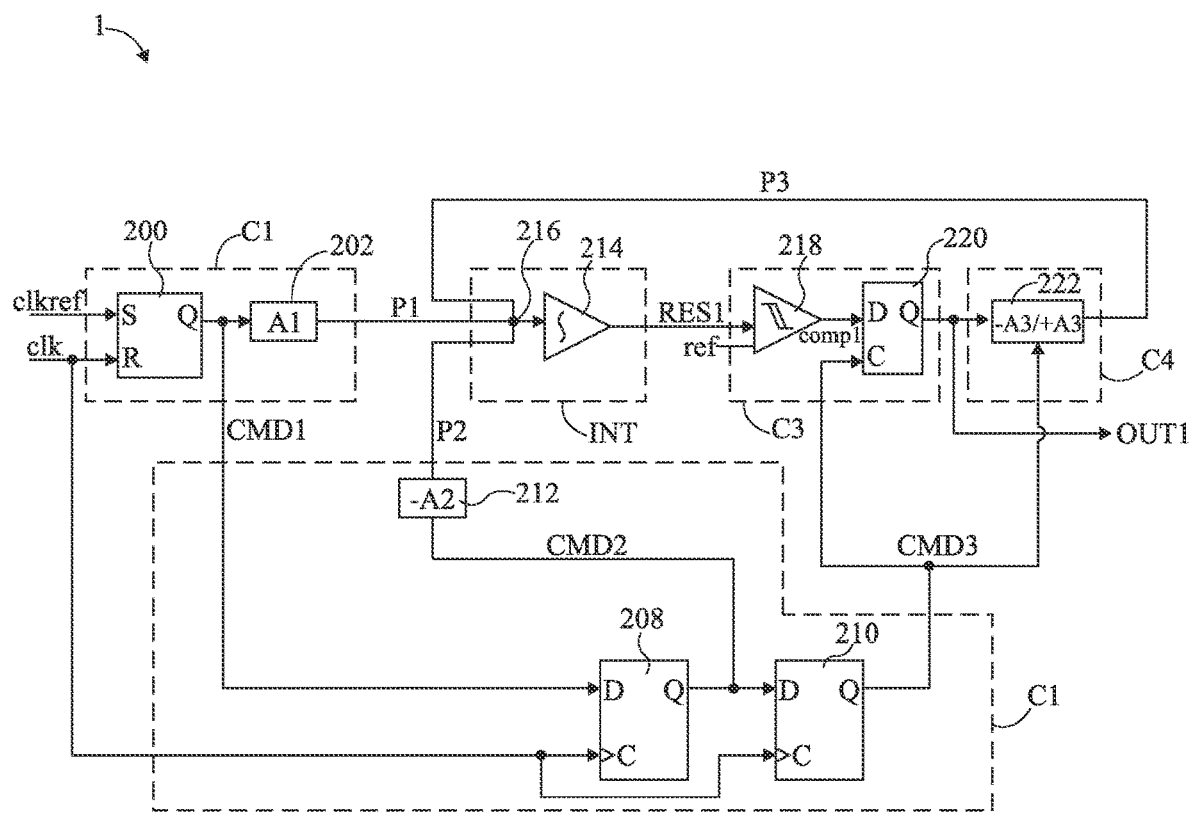
FIG. 5 schematically shows details of an example of embodiment of the time-to-digital converter of FIG. 1, in a case where the converter is implemented in a phase-locked loop of the type of that of FIG. 4.

FIG. 5 schematically shows details of an example of embodiment of the converter 1 of FIG. 1, in a case where the converter is implemented in a phase-locked loop of the type of that of FIG. 4.

In this example of embodiment, signals S2 (FIGS. 1 and 2) and clk are one and the same, and signals S1 (FIGS. 1 and 2) and clkref are one and the same. Further, in this example, the duration of pulses P2 and P3 is equal to a period Tclk of signal clk (K2=K3=1), and amplitudes A2 and A3 are equal to 0.5 time amplitude A1. Thus, the maximum duration Dmax of pulses P1 is equal to Tclk, and, in this example where pulses P1 start with the rising edges of signal S1 and end with the rising edges of signal S2, the dynamic range of converter 1 is also equal to Dmax=Tclk.

The converter 1 of FIG. 5 is similar to the converter 1 of FIG. 3, and only the differences between these converters are here highlighted.

In particular, due to the fact that signals S2 and clk are one and the same, the flip-flop 206 (FIG. 2) of circuit C1 is omitted, and the data input D of the flip-flop 208 of circuit C1 directly receives signal CMD1.

Figure 6:
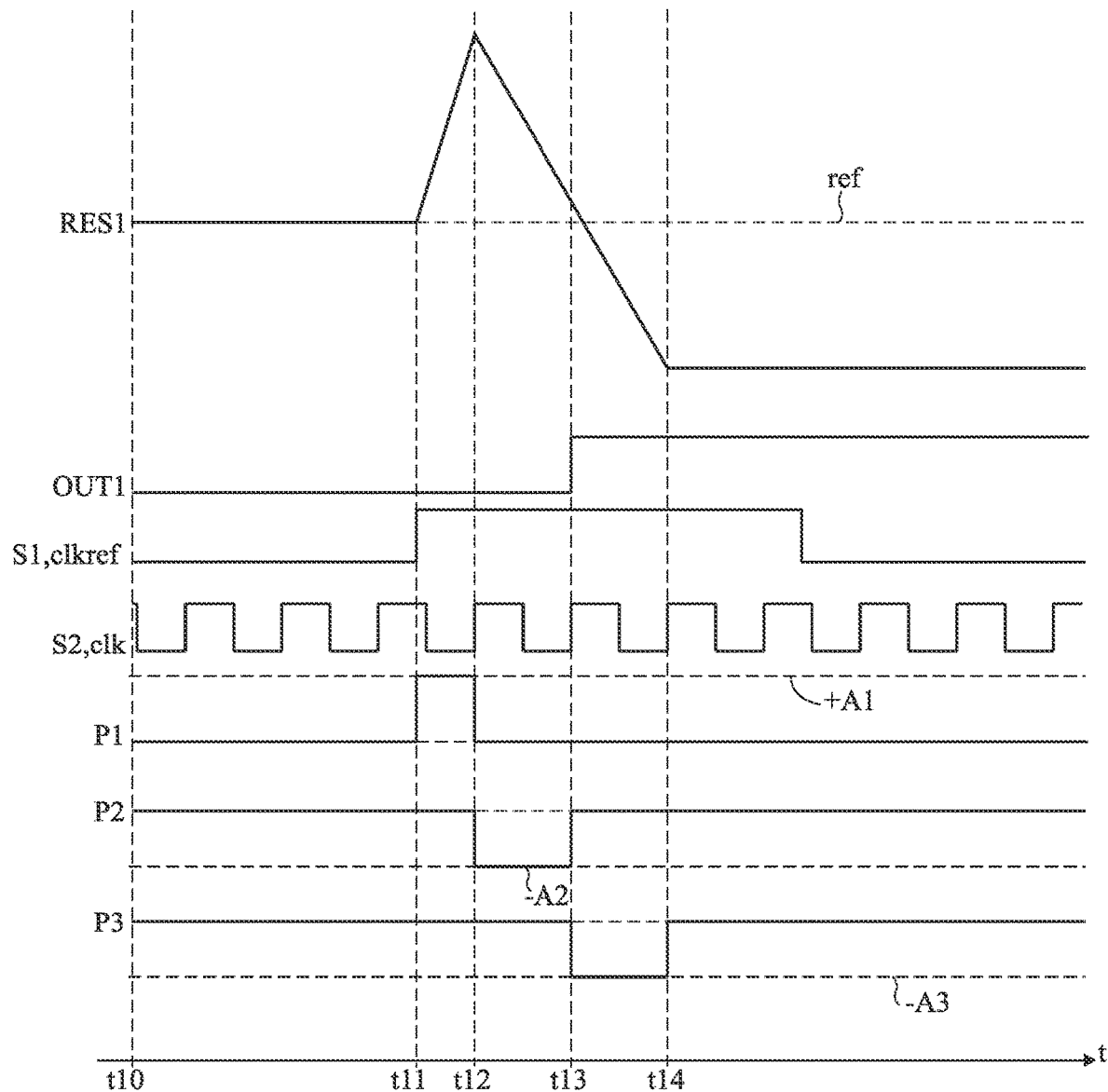
FIG. 6 illustrates in timing diagrams the operation of the converter of FIG. 5.

FIG. 6 illustrates, in timing diagrams, the operation of the converter 1 of FIG. 5.

The timing diagrams of FIG. 6 are similar to those of FIG. 3, and only the differences between the latter will here be highlighted. In particular, FIG. 6 does not comprise signal run due to the fact that the converter 1 of FIG. 5 does not comprise this signal. In the example of FIG. 6, as in the example of FIG. 3, a positive, respectively negative, pulse P1, P2, or P3 at the input of integrator 214 causes an increase, respectively a decrease, of signal RES1, and bit OUT1 is updated in the high, respectively low, state, when at the time of this update, signal RES1 is greater, respectively smaller, than level ref.

In FIG. 6, a time t10 corresponds to the time t0 described in relation with FIG. 3.

In FIG. 6, a time t11 subsequent to time t10 corresponds to the time t1 described in relation with FIG. 3, that is, to an active edge (in this example a rising edge) of signal clkref.

In FIG. 6, a time t12 subsequent to time t11 corresponds to the first active edge (in this example a rising edge) of signal clk following the rising edge of signal clkref at time t1 This rising edge of signal clk causes the end of pulses P1 and CMD1, signal CMD1 not being shown in FIG. 6. Further, this rising edge of signal clk causes the beginning of pulses CMD2 and P2, signal CMD2 not being shown in FIG. 6.

In other words, in FIG. 6, the times t2 (end of pulse P1) and t3 (beginning of pulse P2) described in relation with FIG. 3 are one and the same and correspond to time t12.

In FIG. 6, a time t13 subsequent to time t12 corresponds to the time t4 described in relation with FIG. 3 (rising edge of signal clk, end of pulse P2, and beginning of pulse P3), and a time t14 subsequent to time t13 corresponds to the time t5 described in relation with FIG. 3 (rising edge of signal clk and end of pulse P3).

After time t14, each new rising edge of signal clkref causes a new operating cycle of converter 1, that is, a new succession of pulses P1, P2, and P3, a modification of signal RES1 based on its current value, and an update of bit OUT1 based on signal RES1.

Those skilled in the art are capable of understanding that, in the example illustrated in FIG. 6, the frequency of signal clk is at least three times greater than that of signal clkref so that converter 1 has the time to generate and integrate three successive pulses P1, P2, and P3 after each active edge of signal clkref and before the next active edge of signal clkref.

In the converter 1 of FIG. 5, due to fact that the peak-to-peak amplitude of signal P3 is equal to 2*A3 and is equal to that of signal P1, that is, A1, the converter actually normalizes the value of bit OUT1 over a period of signal clk. In other words, bit OUT1 represents the value of residual phase error PhiError and may be supplied as such to the input of the circuit 400 of the phase-locked loop 4 described in relation with FIG. 4.

Figure 7:
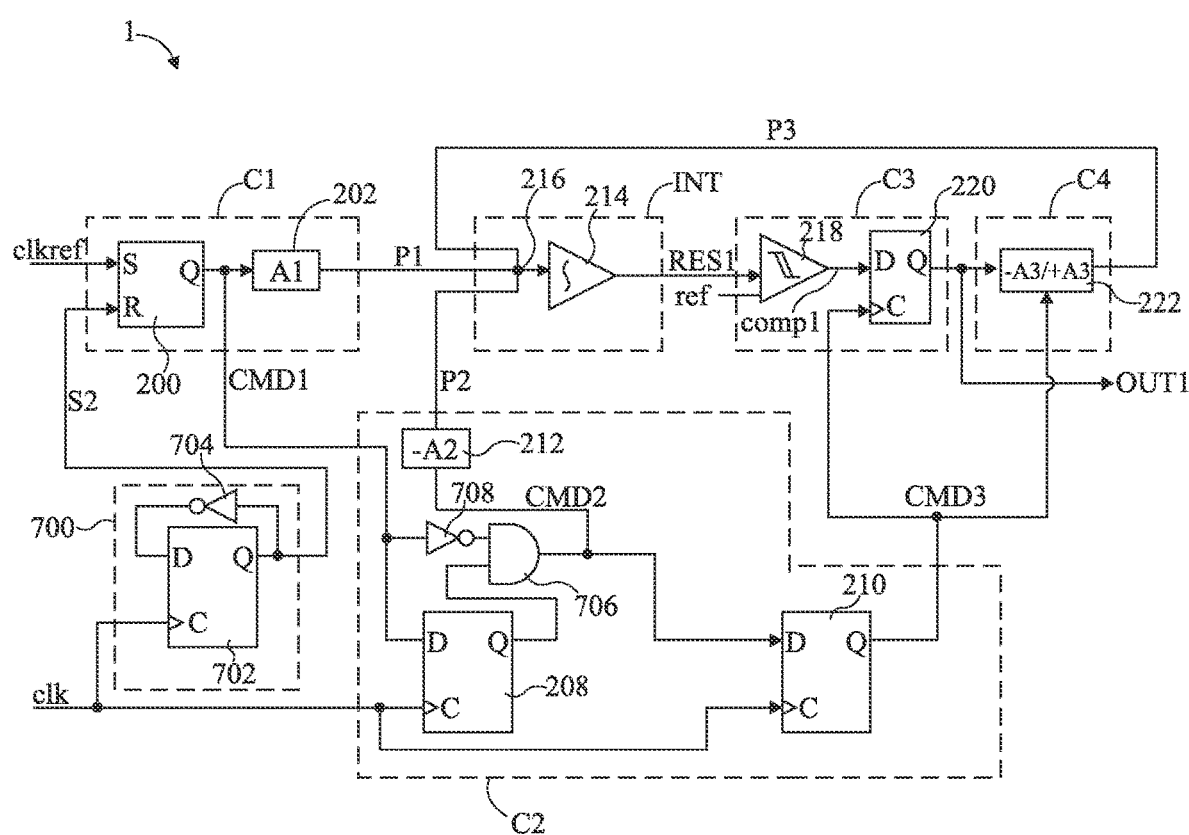
FIG. 7 schematically shows details of another example of embodiment of the time-to-digital converter of FIG. 1, in a case where the converter is implemented in a phase-locked loop of the type of that in FIG. 4.

FIG. 7 schematically shows details of another example of embodiment of the time-to-digital converter of FIG. 1, in a case where the converter is implemented in a phase-locked loop of the type of that of FIG. 4.

In particular, the embodiment of FIG. 7 differs from that of FIG. 5 in that signal S2 (FIGS. 1 and 2) is obtained by dividing by two the frequency of signal clk.

Further, in this example, the duration of pulses P2 and P3 is equal to a period Tclk of signal clk (K2=K3=1), and amplitudes A2 and A3 are equal. In this example where pulses P1 start with the rising edges of signal S1 and end with the rising edges of signal S2, the maximum duration Dmax of pulses P1 is equal to 2*Tclk, whereby amplitude A1 is equal to amplitude A2 and to amplitude A3, the dynamic range of converter 1 also being equal to Dmax=2*Tclk.

More particularly, the converter 1 of FIG. 7 differs from that of FIG. 5 by the implementation of its circuit C2 and of its circuit C1, and by the fact that it further comprises a circuit 700. Circuit 700 is a frequency divider. In other words, circuit 700 is configured to deliver a signal at a frequency divided with respect to the frequency of an input signal of circuit 700.

Circuit 700 is configured to receive signal clk and to supply signal S2, the latter having, in this example, a frequency twice smaller than that of signal clk. In other alternative embodiments, not illustrated, those skilled in the art may provide a ratio different from two between the frequency of signal clk and that of signal S2, by then adapting the amplitudes of pulses P1, P2, and/or P3 and/or the durations of pulses P2 and P3 so that the entire dynamic range of pulses P1 can be converted by converter 1.

As an example, as illustrated in FIG. 7, circuit 700 comprises a D-type flip-flop 702. Flip-flop 702 comprises a clock input C configured to receive signal clk, input C being sensitive to the active edges of signal clk, that is, the rising edges in this example, a Q output configured to deliver signal S2, and a data input D configured to receive the inverse of output Q. As an example, the inverse of the Q output is delivered to input D of flip-flop 702 by an inverter 704. Inverter 704 for example has an input connected to the Q output of flip-flop 702 and an output connected to the D input of the flip-flop.

In this example, the circuit C1 of FIG. 7, and more particularly its circuit 202, differ from those of FIG. 5 in that the pulses P1 that they supply each have an amplitude A1 equal to amplitudes A2 and A3, and not to twice amplitudes A2 and A3 as was the case in the example of FIG. 5. As an example, circuit 202 comprises one or a plurality of resistive elements and/or a switch controlled by signal CMD1.

As compared with the converter 1 described in relation with FIGS. 2 and 5, in the converter 1 of FIG. 7, pulses P1, which each start during an active edge of signal S1 and each end during the next active edge of signal S2, have a maximum duration Dmax equal to two periods Tclk of signal clk. Thus, circuit C2 is modified so that at each pulse P1, the corresponding pulse P2 only starts once pulse P1 is over.

In the example of FIG. 7, as compared with what has been described in relation with FIG. 5, signal CMD2 is not directly available at the output of the flip-flop 208 of circuit C2. More particularly, in FIG. 7, flip-flop 208 still has a D input configured to receive signal CMD1 and a C input configured to receive signal clk and to be sensitive to the active edges of signal clk. However, circuit C2 comprises a logic circuit configured to deliver a pulse CMD2 only when the Q output of flip-flop 208 has switched as a result of a pulse P1 and when this pulse P1 is over. For example, this logic circuit is configured to implement the logic AND between the inverse of signal CMD1 and the Q output of flip-flop 208, the result of this logic operation being signal CMD2. As an example illustrated in FIG. 7, this logic circuit comprises an AND gate 706 having an input connected to Q output of flip-flop 208 and another input connected to the output of an inverter 708 having its input receiving signal CMD1, gate 706 having an output supplying signal CMD2. Of course, those skilled in the art are capable of providing other examples of implementation of this logic circuit.

As in FIGS. 2 and 5, signal CMD2 is supplied to the D input of the flip-flop 210 of circuit C1.

Figure 8:
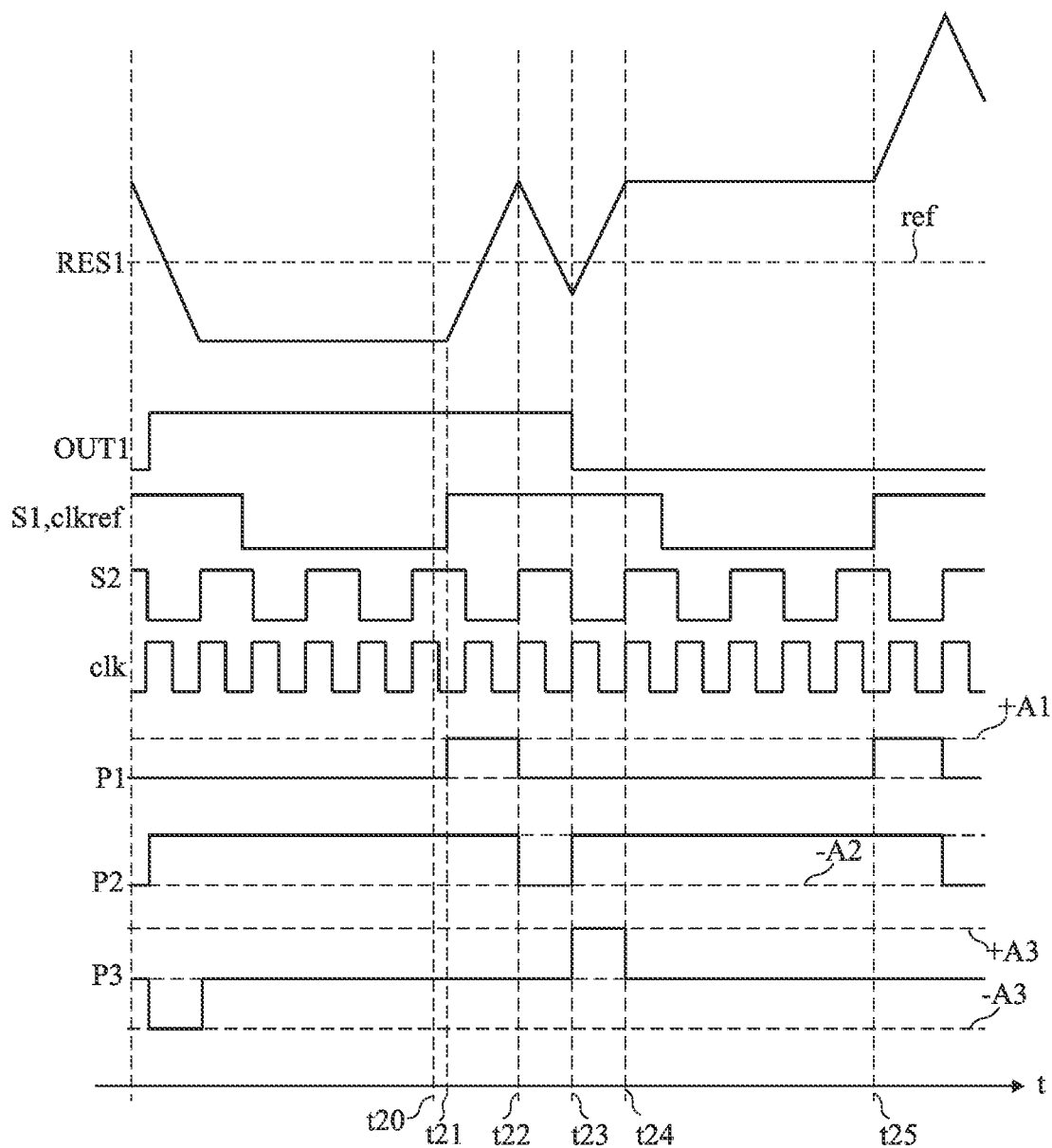
FIG. 8 illustrates in timing diagrams the operation of the converter of FIG. 7.

FIG. 8 illustrates, in timing diagrams, an example of operation of the converter 1 of FIG. 7. In FIG. 8, signal S2 is obtained by dividing by two the frequency of signal clk, and signals S1 and clkref are one and the same.

In the example of FIG. 8, as in the examples of FIGS. 3 and 6, a positive, respectively negative, pulse P1, P2, or P3, at the input of integrator 214 causes an increase, respectively a decrease, of signal RES1, and bit OUT1 is updated to the high, respectively low, state, when at the time of this update, signal RES1 is greater, respectively smaller, than level ref.

As an example, at a time t20, the output RES1 of circuit INT is at a constant or stored value, in this example negative with respect to level ref. Further, signals P1, P2, and P3 are at their zero levels, signal clkref is in the low state, and bit OUT1 is in the high state.

At a time t21 subsequent to time t20, signal clkref switches to the high state, which causes a rising edge of signal CDM1 (not shown in FIG. 8) and the switching of signal P1 to level +A1. In other words, the rising edge of signal clkref causes the beginning of a pulse CMD1 and of a pulse P1.

From time t21, due to the fact that circuit INT (FIG. 7) receives positive pulse P1, signal RES1 varies, in this example increases, with a slope proportional to the level +A1 of pulse P1. Each pulse P1 here has an amplitude equal to A1.

At a time t22 subsequent to time t21, signal S2 switches to the high state. The rising edge of signal S2 results in that signal CMD1 (not shown in FIG. 8) switches to the low state and in that signal P1 switches to its zero level. In other words, the rising edge of signal S2 causes the end of pulse CMD1 and of pulse P1.

Further, the end of pulse CMD1 (not shown in FIG. 8) causes the beginning of a pulse CMD2 (not shown in FIG. 8), and thus the beginning of a pulse P2.

From time t22, due to the fact that circuit INT (FIG. 7) receives negative pulse P2, signal RES1 varies, in this example decreases, with a slope proportional to the level −A2 of pulse P2. Each pulse P2 here has an amplitude equal to A2.

A time t23 subsequent to time t22 corresponds to the next rising edge of signal clk. This rising edge of signal clk results in that signal CMD2 (not shown in FIG. 8) switches to the low state and in that signal P2 switches to its zero level. In other words, this edge of signal clk causes the end of pulses CMD2 and P2.

Further, the rising edge of signal clk at time t23 causes the switching to the high state of signal CMD3 (not shown in FIG. 8) and thus the update of bit OUT1 and the beginning of a pulse P3.

In this example, at time t23, bit OUT1 switches to the low state due to the fact that, at this time t23, signal RES1 is smaller than level ref. Further, in this example, the low state of bit OUT1 results in a positive pulse P3 of level +A3 and the high state of bit OUT1 results in a negative pulse P3 of level −A3. Thus, in this example, the pulse P3 starting at time t23 has a level equal to +A3 since bit OUT1 is in the low state from time t23.

From time t23, due to the fact that circuit INT receives positive pulse P3, signal RES1 varies with a slope proportional to the level +A3 of pulse P3. More particularly, in this example, signal RES1 increase with a slope proportional to the level +A3 of pulse P3.

A time t24 subsequent to time t23 corresponds to the next rising edge of signal clk. This rising edge of signal clk causes the switching to the low state of signal CMD3, and thus the end of pulse P3.

Further, from time t24, as long as circuit INT receives no further pulse P1, P2, or P3, signal RES1 stores its value at time t24.

After time t24, each new rising edge of signal S1 (for example, at time t25 subsequent to time t24) causes a new operating cycle of converter 1, that is, a new succession of pulses P1, P2, and P3, a modification of signal RES1 based on its current value, and an update of bit OUT1 based on signal RES1.

Those skilled in the art are capable of understanding that, in the example illustrated in FIG. 8, the frequency of signal clk is at least four times greater than that of signal clkref so that converter 1 has the time to generate and integrate three successive pulses P1, P2, and P3 after each active edge of signal clkref and before the next active edge of signal clkref.

When the converter 1 of FIG. 7 is implemented in a phase-locked loop of the type of that of FIG. 4, due to the fact that the maximum duration Dmax that pulses P1 can take is equal to two periods Tclk of signal clk, the bit OUT1 of converter 1 is then representative of a residual phase error proportional to twice the residual phase error PhiError between signals clk and clkref. The phase-locked loop 4 described in relation with FIG. 4 is then accordingly modified.

For example, circuit accD is modified to be clocked by signal S2 rather than by signal clk, that is, signal accDOUT is then incremented at the frequency of signal S2.

Further, when circuit accD is modified in this manner, so that loop 4 keeps the same frequency transfer function as with the converter 1 of FIG. 5, circuit accD may then be configured to increment signal accDOUT by value D/2 at each active edge of signal S2 if the value of D is even. As a variant, for loop 4 to keep the same frequency transfer function, for example, when the value of D is odd, circuit accN can then be configured to increment signal accNOUT by twice value N at each rising edge of signal clkref.

Although there has been described in relation with FIGS. 7 and 8 the case where signal S2 is obtained by dividing by two the frequency of signal clk, those skilled in the art are capable of adapting this description to the case where signal S2 is obtained by Euclidean division different from two of signal clk, for example, by accordingly modifying the durations and/or the amplitudes of pulses P1, P2, and P3 so that the entire dynamic range of pulses P1 can be converted by converter 1.

Further, there has been described in relation with FIGS. 7 and 8 an example of an embodiment of converter 1 in the case where the latter is implemented in a phase-locked loop of the type of that of FIG. 4. Those skilled in the art are capable of adapting the converter 1 of FIG. 7 to an implementation in a circuit other than a phase-locked loop. For example, for this purpose, the circuit C2 of the converter 1 of FIG. 7 is modified to comprise flip-flop 206 in such a way as to generate signal run, this signal run being supplied to the input of flip-flop 208 and of logic circuit 708, 706 instead of signal CMD1.

The sigma-delta type converter 1 described in relation with FIGS. 1 to 8 is of order 1, that is, the quantization error is only integrated once at each operating cycle. In this case, the noise shaping slope is for example of 20 dB per decade.

Converter 1 may be modified according to a multi-stage noise shaping architecture (MASH), so that converter 1 then is of order greater than 1, the order of converter 1 then corresponding to the number of integrations of the quantization error per operating cycle of converter 1. In this case, converter 1 comprises a first stage comprising the previously described circuits INT, C1, C2, C3, and C4, and a second stage configured to receive the output signal RES1 of the circuit INT of the first stage, and to generate, at the output of the second stage, a digital signal from signal RES1, preferably by implementing an integration of a signal determined by signal RES1. The digital output signal TDCOUT of converter 1 is then determined at least partly by bit OUT1 and the digital output signal of the second stage.

According to an embodiment, the second stage is configured to:
generate, after each pulse P3, a pulse CMD4 starting in synchronism with signal clk;
integrate, during each pulse P4, a sum of the output signal RES1 of circuit INT and of a feedback signal CR, quantize over one bit a result RES2 of said integration, and store over a bit OUT2 said binary quantization at the end of pulse CMD4;
generate, during each pulse P3, a pulse P4 based on bit OUT2, and signal CR by integrating pulse P4; and
store bit OUT2 over a bit OUT2-1 at each active edge of signal S2, the digital output signal of the second stage being generated based on bits OUT2 and OUT2-1 or corresponding to bits OUT2 and OUT2-1.

In other words, the second stage is configured to receive as an input the residual quantization error available at the output of circuit INT after each pulse P3, and to integrate it once again. Further, the second stage implements a negative sigma-delta feedback due to the signal CR determined based on bit OUT2. The determination of signal CR is implemented, after each operating cycle of the converter and before the beginning of the corresponding pulse CMD4. During each pulse CMD4, signal CR is added to signal RES1 and the second stage integrates the sum S of signals RES1 and CR. The result RES2 of this integration is quantized and stored over bit OUT2.

As an example, the output TDCOUT of the converter 1 of order 2 is obtained by adding the output OUT1 of the first stage to the mathematical derivative of the signal OUT2 of the second stage.

As an example, the negative feedback, that is, the determination of signal CR, comprises the integration of pulse P4 having its sign determined by the state of bit OUT2. The result of this integration then corresponds to signal CR and is reset before each new integration of a pulse P4, and thus at each operating cycle of converter 1. As an example, due to the fact that each pulse P4 is generated during a pulse CMD3, the duration of each pulse P4 is equal to K4*Tclk, K4 being a positive integer equal to K3.

Due to the fact that the second stage implements a second integration of the quantization error, the noise shaping slope is, for example, at least 40 dB per decade and depends on the number of stages cascaded in converter 1, the slope being for example equal to 40 dB per decade when MASH-type sigma-delta converter 1 comprises exactly two stages.

The more significant shaping of the noise resulting from the increase of the order of converter 1 enables to further decrease the low-frequency noise. Further, the increase of the order of converter 1 enables to obtain a purer frequency spectrum as concerns signal clk.

MASH-type converters 1 of order greater than two are constructed by cascading the stages in the same way as what has been discussed for the first stage and the second stage of the converter 1 of order 2. For example, the output of the integrator of the N-th stage N is supplied to the input of the N+1-th stage and the quantized output derived from stage N+1 is added to the quantized output of stage N. For each additional stage, an additional pulse is added to the operating cycle of converter 1, to synchronize the operation of this stage with the other stages of converter 1.

Figure 9:
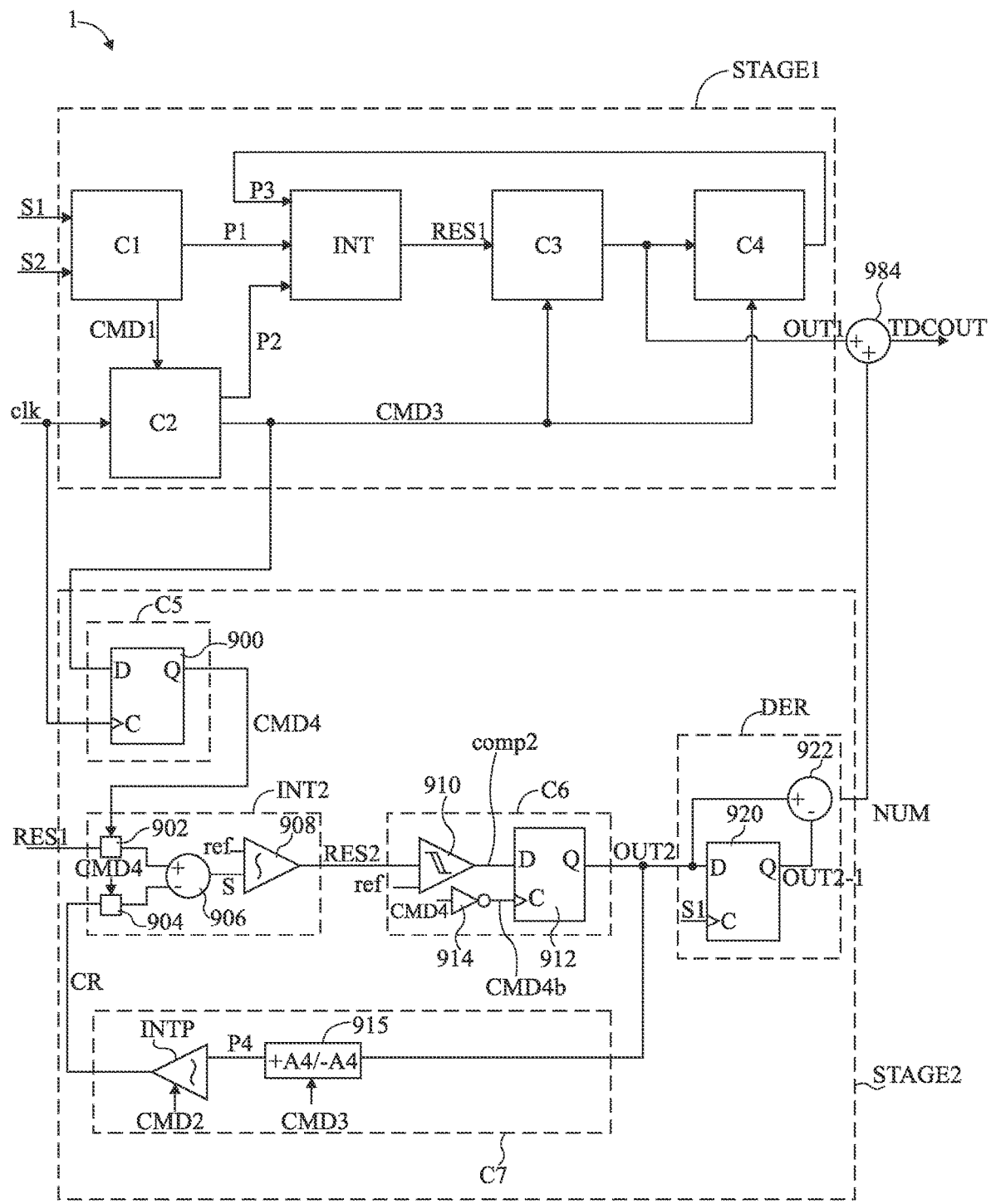
FIG. 9 illustrates an alternative embodiment of the converter of FIG. 1.

FIG. 9 illustrates an alternative embodiment of the converter 1 of FIG. 1. More particularly, FIG. 9 illustrates an example of implementation of converter 1 when the latter is of MASH type or order 2. In this FIG. 9, the first stage of converter 1 is referenced as STAGE1 and delimited by dotted lines, the second stage of converter 1 being referenced as STAGE2 and delimited by dotted lines.

Stage STAGE1 comprises circuits C1, C2, C3, C4, and INT, represented and connected in FIG. 9 in the same way as in FIG. 1. The output signal of stage STAGE1 is bit OUT1. As an example, circuits C1, C2, INT, C3, and C4 are implemented as described in relation with FIG. 2.

Stage STAGE2 comprises, in this example, circuits C5, INT2, C6, C7, and DER, examples of implementation of which are described in further detail hereafter. Those skilled in the art however capable of providing other examples of implementation of at least one of these circuits C5, INT2, C6, C7, and DER, based on the functional description which will be made thereof.

Circuit C5 is configured to generate, after each pulse P3, a corresponding pulse CMD4. Each pulse CMD4 has a duration equal to K4*Tclk, K4 being a positive integer equal to K3. As an example, circuit C5 receives signal CMD3 indicating the beginning and the end of each pulse P3, which enables the pulses received by circuit C5 to all have the same sign. In the example illustrated in FIG. 9, circuit C5 comprises a flip-flop 900, for example of type D. As an example, flip-flop 900 comprises an input D receiving signal CMD3, a clock input C receiving signal clk, and an output Q supplying pulses CMD4 in this example where K4=K3=1.

Circuit INT2 is an integrator circuit configured to integrate, during each pulse CMD4, the sum S of signal RES1 and of signal R. Circuit INT2 supplies a signal RES2 corresponding to the result of this integration.

As an example, circuit INT2 receives signals RES1, CR, and CDM4. At each pulse CMD4, all along the duration of pulse P4, circuit INT2 is for example configured to add signals RES1 and CR and to integrate this sum S.

As an example of implementation illustrated in FIG. 9, circuit INT2 comprises two switches 902 and 904 controlled by signal CMD4, for example configured to be on during each pulse CMD4, a circuit 906, and an integrator circuit 908, for example implemented from an operational amplifier. More particularly, switch 902 is configured to receive signal RES1 and to transmit this signal to circuit 906 only during each pulse CMD4, switch 904 is configured to receive signal RES1 and to supply this signal to circuit 906 only during each pulse CMD4, circuit 906 is configured to supply signal S equal to the sum of the signals that it receives from switches 902 and 904, and circuit 908 is configured to integrate signal S. Circuit 908 supplies signal RES2.

According to another example, not illustrated, in circuit INT2, signals RES1 and CR are first added, and the signal corresponding to this sum is delivered to integrator circuit 908 during each pulse CMD4, for example by means of a switch controlled by pulses CMD4.

Circuit C6 is configured to quantize signal RES2 over one bit and to store the result of this binary quantization over bit OUT2 at the end of each pulse P4. The quantization of signal RES2 is performed by comparing signal RES1 with signal ref. As an example, circuit C6 generates a bit comp2 corresponding to the result of the binary quantization of signal RES2, and updates bit OUT2 from bit comp2.

As an example of implementation illustrated in FIG. 9, circuit C4 comprises a comparator 910 configured to receive signal RES2 and level, or potential, ref and to supply bit comp2. As an example, bit comp2 is in a first binary state when signal RES2 is greater than level ref and in a second binary state when signal RES2 is smaller than level ref. Circuit C6 also comprises a storage element 912, for example, a flip-flop, for example, of type D, configured to supply bit OUT2 based on signal comp2, and update the state of bit OUT2 at the end of each pulse P4. In other words, element 912 is configured to sample bit comp2, for example, at each rising or falling edge of signal CMD4, and to store on bit OUT2 the sampled level of bit comp2. For example, D-type flip-flop 912 comprises an input D configured to receive signal comp2, a clock input C sensitive to rising edges and configured to receive a signal CMD4b complementary to signal CMD4, and a Q output configured to supply signal OUT2, signal CMD4b being for example available at the output of an inverter 914 receiving signal CMD4 as an input signal.

Circuit C7 is configured to supply signal CR based on bit OUT2. More particularly, circuit C7 is configured, at each operating cycle of converter 1 and before the beginning of the pulse CMD4 of this operating cycle, for example, during the pulse CMD3 of this operating cycle, to generate a pulse P4 of same duration as pulses P3 and to integrate this pulse P4. Further, each pulse P4 is signed and has its sign determined by the binary state of signal OUT2. In other words, circuit C7 is configured, at each pulse CMD3, to supply signal CR by integrating, during this pulse CMD3, the pulse P4 determined based on bit OUT2. Pulses P4 all have an amplitude A4, for example equal to the amplitude A3 of pulses P3.

As an example of implementation illustrated by FIG. 9, circuit C7 comprises a circuit INTP configured to integrate pulses P4, and a circuit 915 (block +A4/−A4 in FIG. 9) configured to supply pulses P4 based on bit OUT2 and based on signal CMD3. Circuit 915 supplies pulses P4 to circuit INTP. Conversely to integrator circuits INT (not shown in FIG. 9) and INT2, the output of integrator circuit INTP is reset after each pulse CMD4, for example, during the next pulse P2. For example, circuit INTP receives signal CMD2 and its output is reset at each pulse CMD2.

The case where a positive, respectively negative, pulse S at the input of integrator 908 causes a decrease, respectively an increase, of signal RES2, and where a positive, respectively negative, pulse P4 at the input of integrator INTP causes a decrease, respectively an increase, of signal CR is considered as an example. In this example, pulse P4 are negative and have a level equal to −A4 when bit OUT2 is in a binary state indicating that signal RES2 is greater than level ref, and are positive and have a level equal to +A4 when bit OUT2 is in a binary state indicating that signal RES2 is smaller than level ref. The amplitude A4 of pulses is preferably determined so that K3*A2=K4*A4, and is thus equal to the amplitude A3 of pulses P3 in this example where K3=K4.

Those skilled in the art will be capable of deducing from the above example the polarity of pulses P4 according to the state of bit OUT2 in the case where a positive, respectively negative, pulse S at the input of integrator 918 causes an increase, respectively a decrease, in signal RES2 and/or a positive, respectively negative, pulse P4 at the input of integrator INTP causes an increase, respectively a decrease, of signal CR.

In this example, second stage STAGE2 supplies a digital output signal NUM based on bits OUT2 and OUT2-1. In this example, circuit DER is configured to supply signal NUM based on bit OUT2. More particularly, circuit DER is configured to generate bit OUT2-1 based on bit OUT2 and to supply signal NUM based on bits OUT2 and OUT2-1. Circuit DER implements a derived function on signal OUT2, having as a result digital signal NUM. Circuit DER is a digital circuit clocked by signal S1. In other words, circuit DER is a differentiating circuit clocked by signal S1 and configured to supply signal NUM based on signal OUT2.

Since bit OUT2 represents the result of a double integration while bit OUT1 represents the result of a single integration, the implementation of a derived function on signal OUT2 to obtain signal NUM enables signal NUM to be coherent with signal OUT1.

As an example of implementation, circuit DER comprises a D-type flip-flop 920 comprising an input D configured to receive signal OUT2, a clock input C configured to receive signal S1, and an output Q configured to supply signal OUT2-1. Circuit DER further comprises a circuit 922 configured to subtract signal OUT2-1 from signal OUT2, the result of this subtraction corresponding to the output bits NUM of stage STAGE2. As an example, signal NUM corresponds to two bits and is coded as a complement to 2.

In this example where the second stage supplies the signal NUM which corresponds to the result of the derivative of bit OUT2, converter 1 further comprises a circuit 984 configured to supply the output signal TDCOUT of converter 1 based on, signals, or bits, OUT1 and NUM. As an example, circuit 984 is configured to add signals NUM and OUT1 and to supply signal TDCOUT, which then corresponds to the result of this sum. As an example, signal TDCOUT is a binary word over three bits, coded as a complement to 2.

In another example, not illustrated in FIG. 9, the second stage STAGE2 does not comprise circuit 922 and then supplies a digital output signal corresponding to the two bits OUT2 and OUT2-1. Further, converter 1 then does not comprise circuit 984 but comprises instead an arithmetic circuit configured to supply output signal TDCOUT based on bits OUT1, OUT2, and OUT2-1. This arithmetic circuit is configured to simultaneously implement the mathematical derivative of signal OUT2 based on bits OUT2 and OUT2-1, and the sum of this derivative with bit OUT1.

There has been considered, in relation with FIG. 9, the case where signal S1 does not correspond to the signal clkref received by a phase-locked loop of the type of that of FIG. 4. Based on the descriptions made in relation with FIGS. 4 to 9, those skilled in the art will be capable of adapting the description made in relation with FIG. 9 to the cases where:

the duration Dmax of pulses P1 is different from a period Tclk of signal clk and is, for example, equal to two periods Tclk of signal clk, and/or signal S1 corresponds to the signal clkref of a phase-locked loop of the type of that described in relation with FIG. 4, and/or signal S2 corresponds to the signal clk of a phase-locked loop of the type of that described in relation with FIG. 4 or is obtained by Euclidean division, for example, equal to two, of the frequency of this signal clk, and/or converter 1 is of order greater than 2.

For example, those skilled in the art will be able to modify, based on the description made in relation with FIGS. 5 to 8, the converter 1 of FIG. 9 to implement it in a phase-locked loop of the type of that described in relation with FIG. 4.

For example, when the converter 1 of order 2 described in relation with FIG. 9 is implemented in a phase-locked loop of the type of that in FIG. 4, and the first stage STAGE1 of converter 1 of order 2 corresponds to the converter of order 1 described in relation with FIG. 5, the frequency of signal clk then being at least 4 times larger than that of signal S1. As a variant, when the converter 1 of order 2 described in relation with FIG. 9 is implemented in a phase-locked loop of the type of that in FIG. 4, and the first stage STAGE1 of converter 1 of order 2 corresponds to the converter 1 of order 1 described in relation with FIG. 7, the frequency of signal clk then being at least 5 times greater than that of signal S1.

Figure 10:
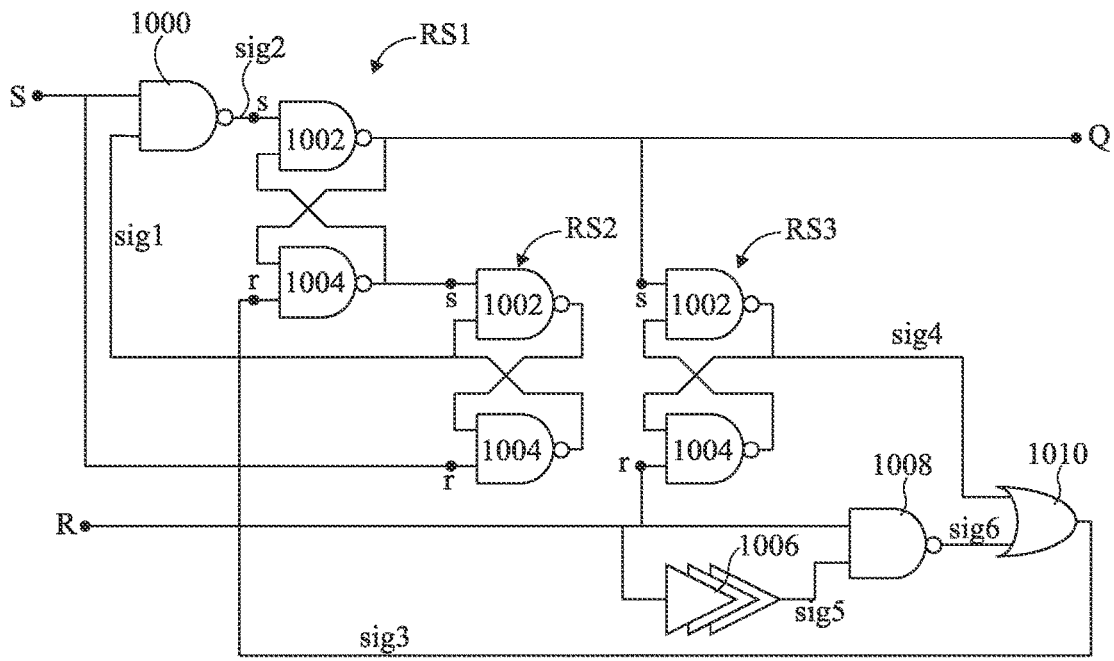
FIG. 10 illustrates an example of implementation of a portion of the converter of the previous drawings.

FIG. 10 illustrates an example of implementation of a portion of the converter 1 of the previous drawings. More particularly, FIG. 10 illustrates an example of embodiment of an RS flip-flop, for example, the RS flip-flop of circuit C1, configured to take into account possible metastability issues.

In this example, the RS flip-flop is active on rising edges, or, in other words, the S and R inputs of the flip-flop are both sensitive to rising edges of the signals that they receive.

The flip-flop comprises a NAND gate 1000 having an input connected to the S input and an input configured to receive a signal sig1. The output of gate 1000 supplies a signal sig2.

The flip-flop comprises three identical assemblies RS1, RS2, and RS3 of two NAND gates 1002 and 1004. Each assembly RS1, RS2, and RS3 comprises an s input connected to a first input of its gate 1002 and an r input connected to a first input of its gate 1004, the output of gate 1002 being connected to a second input of gate 1004, and the output of gate 1004 being connected to a second input of gate 1002.

The s input of assembly RS1 receives signal sig2, and the output of the gate 1002 of assembly RS1 forms the Q output of the RS flip-flop of FIG. 10. Further, the r input of assembly RS1 receives a signal sig3.

The s input of assembly RS2 is connected to the output of the gate 1004 of assembly RS1, the r input of assembly RS2 is connected to the S input of the RS flip-flop of FIG. 10, and the output of the gate 1004 of assembly RS2 supplies signal sig1.

The s input of assembly RS3 is connected to the output of the gate 1002 of assembly RS1, and thus to the Q output of the flip-flop, the r input of assembly RS3 is connected to the R input of the flip-flop, and the output of the gate 1002 of assembly RS3 supplies a signal sig4.

The flip-flop further comprises a circuit 1006, for example, a chain of inverters in series, having an input connected to the R input of the flip-flop and an output supplying a signal sig5. Circuit 1006 is configured to delay the signal received by the R input by a time period DT, signal sig5 corresponding to this delayed signal.

The RS flip-flop of FIG. 10 further comprises a NAND gate 1008 having an input connected to the R input of the flip-flop, and another input connected to the output of circuit 1006 to receive signal sig5, and an output configured to supply a signal sig6.

The flip-flop further comprises an OR gate having an input receiving signal sig6, and input receiving signal sig4, and an output supplying signal sig3.

If it is assumed that initially, the Q output is at the low level, signal sig1 is at the high level. Thereby, the arrival of a high level on the S input may propagate through gate 1000, which then supplies a low level of signal sig2. Assembly SR1 then switches the Q output to the high level. Signal sig3 is initially at the high level and its switching to the low level will enable to switch back the Q output to low level 0. At the same time, since signal sig3 is still at the high level, the s input of assembly RS2 receives a low level. Since the r input of assembly RS2 is connected to the S input which has switched to the high level, signal sig1 switches to the low level, which results in that signal sig2 switches to the high level. This mechanism makes the flip-flop sensitive only to the rising edges of S, the Q output remaining memorized at the high level as long as signal sig3 has not transited through the low level. To activate again the Q output, the S input will have to switch to the low level and signal sig1 will have to switch to the high level. In parallel, assembly RS3 initially supplies signal sig4 at the high level, due to the fact that the Q output is initially at the low level. When signal Q switches to the high level, there exist two possibilities. Either the R input was already at the high level at that time and signal sig4 remains at the high level, or the R input was at the low level and in this case signal sig4 switches to the low level. This mechanism is important since the rising edge of input R may occur at any time with respect to the rising edge of output Q. In particular, output Q and input R may exhibit a rising edge at the same time. In this case, assembly RS3 enters a metastable state, where signal sig4 takes more time to "choose" between a low level and a high level. In the most unfavorable case, signal sig4 will only switch due to the electronic noise present in the circuit and thus at a random time. Since the standard deviation of this noise can be known, it is possible to know the maximum time Tmax that may be necessary for signal sig4 to switch. The aim of circuit 1006 and of signal sig6 is to leave time to assembly RS3 to leave the metastability and switch. Gate 1008 enables to set signal sig6 to the low level only when input R has been at the high level for a time period at least equal to Tmax. Since signal sig3 is the result of the logic OR between signals sig4 and sig6, if sig6 has finally switched to the low level, it will have to be awaited for duration DT for signal sig3 and then output Q to switch to the low level. If it can be guaranteed that duration DT is greater than duration Tmax, signal sig3 will not be submitted to the random delay due to the metastability but only to a constant delay equal to DT. Thereby, the falling edge of the pulse on output Q can avoid being tainted by a jitter adversely affecting the result.

As an example, when the flip-flop 200 of circuit C1 is implemented as described in relation with FIG. 10, the duration Dmax of pulses P1 is increased by DT, and this duration DT has to be compensated for by pulses P2, by increasing the duration of the pulses P2 by a time period DT2. As a result, DT*A1=DT2*A2, and thus DT2=(DT*A1)/A2. For example, in the case where A1=2*A2, then DT2=2*DT.

Of course, although the flip-flop described in relation with FIG. 10 is particularly adapted to an implementation in the circuit C1 of converter 1, a simpler flip-flop, for example, an RS flip-flop similar to one of assemblies RS1, RS2, and RS3, but which does not address metastability issues, may be used to implement circuit C1.

Figure 11:
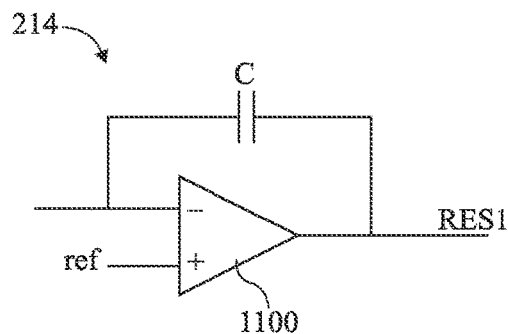
FIG. 11 illustrates an example of implementation of another portion of the converter of the previous drawings.

FIG. 11 illustrates an example of implementation of another portion of the converter 1 of the previous drawings. More particularly, FIG. 11 illustrates an example of implementation of circuit 214, it being understood that circuit 912 may be implemented in the same way.

In this example, circuit 214 comprises an operational amplifier 1100 having a first input, in this example the inverting input −, configured to receive the pulses to be integrated, a second input, in this example, the non-inverting input +, receiving any potential, preferably potential ref as illustrated in FIG. 11, and an output supplying the result of the integration, that is, signal RES1 for circuit 214. A capacitive element C is connected between the output of amplifier 1100 and the non-inverting input − of amplifier 1100.

In this example, circuit 214 receives the pulses to be integrated on the inverting input − of amplifier 1100. As a result, a positive, respectively negative, pulse, causes a decrease, respectively an increase, of signal RES1 with a slope proportional to the amplitude of the pulse.

In practice, the circuit 214 of FIG. 11 is a low-pass filter of cut-off frequency f0 having the behavior of a pure integrator for frequencies greater than frequency f0. Frequency f0 particularly depends on the value of capacitive element C. Thus, it will still be possible to select frequency f0 sufficiently low as compared with the frequency of signal clk for circuit 214 to behave, in converter 1, as a pure integrator.

It should be noted that if the inverting input − of amplifier 1100 is left in a high impedance state, no current flows through capacitive element C and, since the leakage currents are low, the amplifier output memorizes its state, that is, it remains constant and equal to the value that it had at the time when the inverting input − has switched to the high impedance state.

Figure 12:
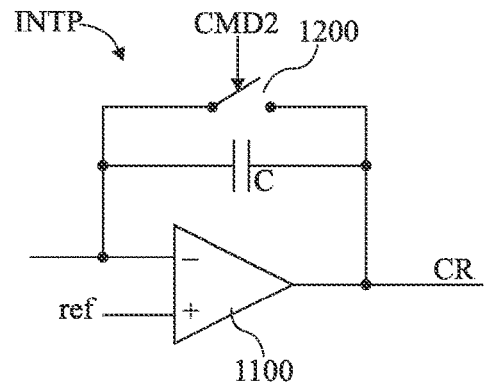
FIG. 12 illustrates an example of implementation of still another portion of the converter of the previous drawings.

FIG. 12 illustrates an example of implementation of still another portion of the converter 1 of the previous drawings. More particularly, FIG. 11 illustrates an example of implementation of circuits INTP.

Circuit INTP differs from circuit 214 in that the output of amplifier 1100 supplies signal CR and in that a switch 1200 is connected in parallel with capacitive element C. Switch 1200 is configured, when it is in the on state, to reset to the level of non-inverting input +, preferably level ref as illustrated in FIG. 12, the output of amplifier 1100. Switch 1200 is for example controlled by signal CMD2 and is then configured to be on at each pulse CMD2.

In this example, as in FIG. 10, circuit INTP receives pulses to be integrated on the inverting input of amplifier 1100. As a result, a positive, respectively negative, pulse, causes a decrease, respectively an increase, of signal CR with a slope proportional to the amplitude of the pulse.

The implementation of circuits 214, 912, and INTP is not limited to the examples described in relation with FIGS. 11 and 12, and those skilled in the art may use usual integrators to implement circuits INT, INT2, and INTP. In particular, those skilled in the art are capable of providing integrators having their output signal increasing, respectively decreasing, when they receive a positive, respectively negative, pulse to be integrated, as described as an example in relation with FIGS. 3, 6, and 8.

Figure 13:
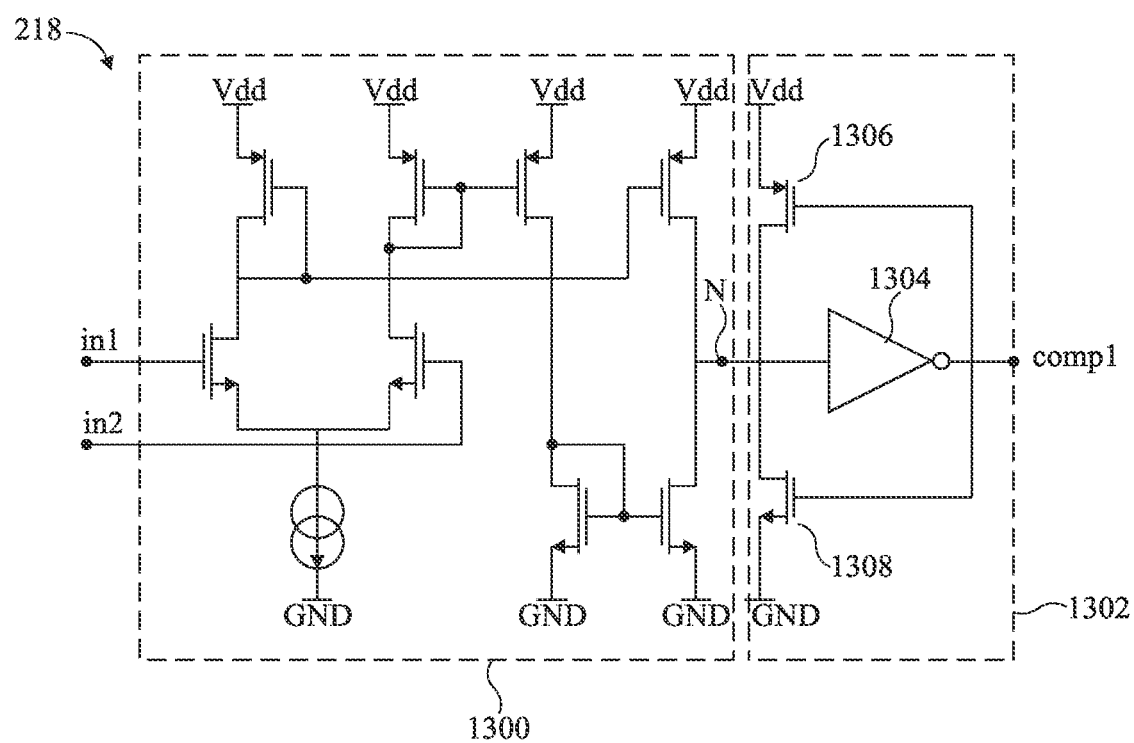
FIG. 13 illustrates an example of implementation of still another portion of the converter of the previous drawings.

FIG. 13 illustrates an example of implementation of still another portion of the converter 1 of the previous drawings. More particularly, FIG. 13 illustrates an example of implementation of circuit 218, it being understood that circuit 910 may be implemented in the same way. In this example, the low power supply level of converter 1, and thus of comparator 218 is ground GND, and level ref is equal to Vdd/2.

In this example, circuit 218 comprises a conventional differential amplifier 1300 (in dotted lines in FIG. 13) having an inverting input in1, an inverting input in2, and an output N.

In this example, circuit 218 further comprises, connected to output N of amplifier 1300, a stage 1302 comprising an inverter 1304 and two transistors 1306 and 1308, respectively with a P channel and an N channel. Inverter 1304 has an input connected to output N of stage 1300 and an output delivering the output signal comp1 of circuit 218. Transistor 1306 is connected between node N and potential Vdd, transistor 1308 being connected between node N and the low power supply potential, here, ground GND. Transistors 1306 and 1308 are controlled by the output of inverter 1304, that is, by the output of circuit 218.

Transistors 1306 and 1308 implement a positive feedback of the output of inverter 1304 on output N of stage 1300, which enables to accelerate the switching of signal comp1. This enables to obtain a signal comp1 having clearly distinct high and low levels, even when the value of input in1 is close to that of input in2.

Of course, the implementation of circuits 218 and 910 is not limited to the example illustrated in FIG. 13, and those skilled in the art may use other usual threshold comparators to implement circuits C3 and C6. In particular, the implementation of the threshold comparators is not limited to the case where ref is equal to half the power supply voltage of the comparator.

Figure 14:
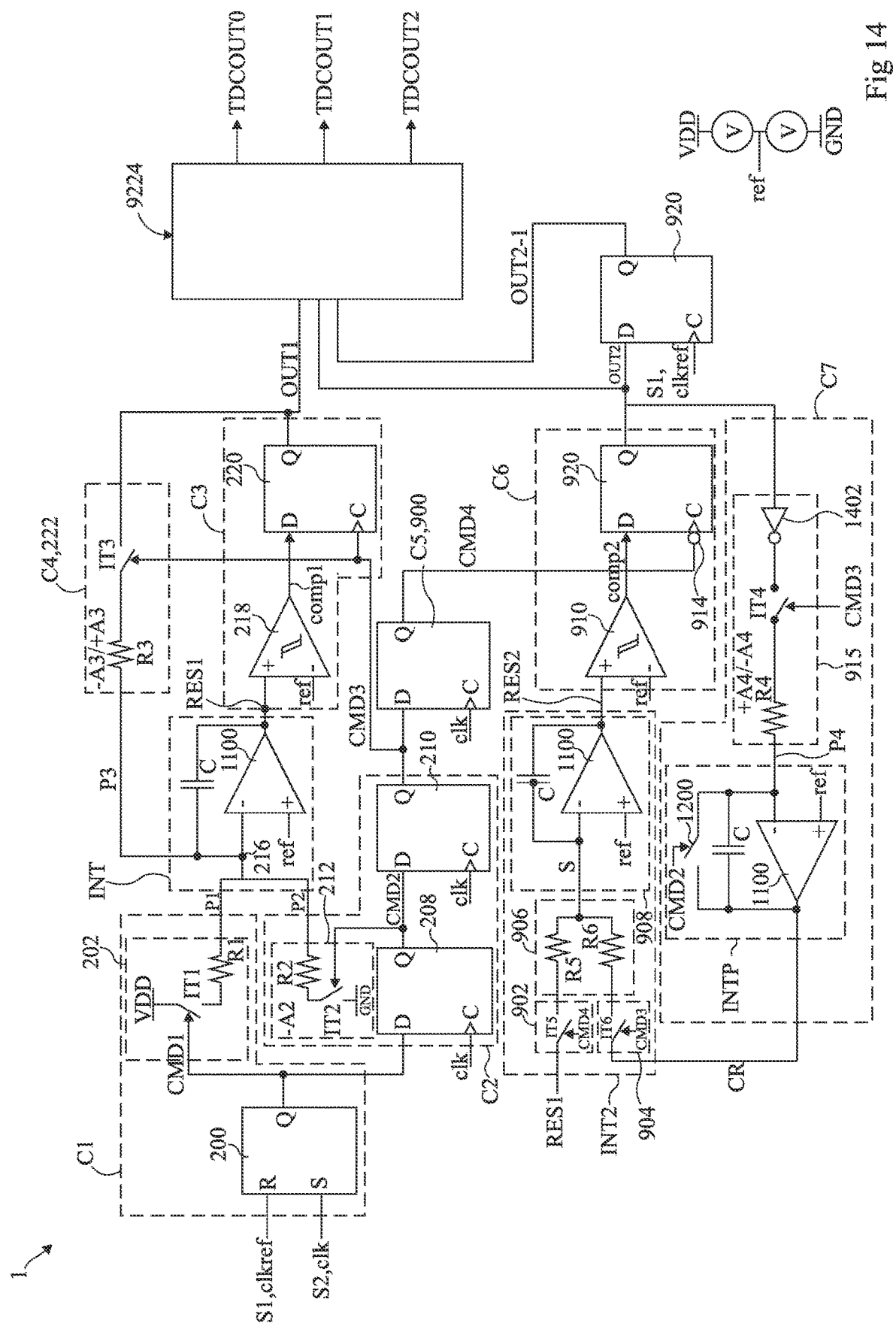
FIG. 14 illustrates a detailed embodiment of the alternative embodiment of FIG. 9.

FIG. 14 illustrates a detailed example of implementation of the converter 1 described in relation with FIG. 9. In this example, stage STAGE1 corresponds to the converter 1 described in relation with FIG. 5, that is, signal S1 corresponds to signal clkref and signal S2 corresponds to signal clk. In this example, K2=K3=1.

In this example, the low power supply potential of converter 1 is ground GND, and level ref is equal to Vdd/2. However, those skilled in the art are capable of adapting the following description to the case where the low power supply potential is a potential Vss equal to −Vdd and where level ref is ground GND and, more generally to the case where level ref is different from half the power supply voltage of converter 1.

In this example, circuit C1, as in FIG. 5, comprises the RS-type flip-flop 200 configured to supply signal CMD1. Further, in this example, the circuit 202 of circuit C1 comprises a switch IT1 in series with resistor R1, between high power supply potential Vdd and node 216, switch IT1 being preferably connected to potential Vdd. Switch IT1 is controlled by signal CMD1 to only be on during pulses CMD1. Thus, each pulse CMD1 results in a positive current pulse P1 on node 216, of level +A1. The amplitude A1 of pulses P1 is the difference between potentials Vdd and ref divided by the value of resistance R1.

In this example, circuit C2 is implemented as described in relation with FIG. 5. Further, the circuit 212 of circuit C2 comprises, in this example, a switch IT2 in series with a resistor R2, between the low power supply potential, here ground GND, and node 216, switch IT2 being preferably connected to low power supply potential GND. Switch IT2 is controlled by signal CMD2 to only be on during pulses CMD2. Thus, each pulse CMD2 results in a negative current pulse P2 on node 216, of level −A2. The amplitude of pulses P2 is determined by the difference between potentials ref and GND divided by the value of resistance R2. In this example where the amplitude A1 of pulses P1 is equal to twice the amplitude A2 of pulses P2, resistor R2 has a value twice greater than that of resistor R1.

In this example, circuit INT is implemented as described in relation with FIG. 11, and thus comprises an amplifier 1100 and a capacitive element C. The inverting input − of the amplifier 1100 of circuit INT is connected to node 216, the non-inverting input + of the amplifier 1100 of circuit INT being connected to potential ref. Thus, in this example, signal RES1 increases, respectively decreases, when the amplifier 1100 of circuit INT receives a negative, respectively positive, pulse on its input −.

In this example, circuit C3 is implemented as described in relation with FIG. 5. As an example, circuit 218 is implemented as described in relation with FIG. 13 and receives level ref on its inverting input (in1 in FIG. 13 and − in FIG. 14) and signal RES1 on its non-inverting input (in2 in FIG. 13 and + in FIG. 14). Thus, in this example, signal comp1 is at a high, respectively low, level when signal RES1 is greater, respectively smaller, than level ref, and bit OUT1 is updated with the level of signal comp1 at each beginning of a pulse CMD3. As a result, as compared with the operation described in relation with the timing diagrams of FIGS. 3, 6, and 8, the variation direction of signal RES1 according to the polarity of the pulses received by circuit INT is inverted, which causes an inversion of bit OUT1.

In this example, circuit C4 (or 222 or block −A3/+A3) comprises a switch IT3 and a resistor R3 in series between the output of circuit C3 and node 216. Switch IT3 is controlled by signal CMD3 to only be on during pulses CMD3. Thus, each pulse CMD3 results in a pulse P3 on node 216, which has a negative or positive level −A3 or +A3 according to whether the output of circuit C3 (bit OUT1) is respectively at the low level equal to the low power supply potential or at the high level equal to the high power supply potential. In this example, due to the fact that the variations of signal RES1 relatively to the polarity of the pulses are inverted, and thus that the state of bit OUT1 is inverted, with respect to the operation described in relation with FIGS. 3, 6, and 8, the polarity of pulses P3 relatively to the high or low state of signal OUT1 is also inverted with respect to what has been described in relation with FIGS. 3, 6, and 8. Further, the amplitude A3 of pulses P3 is determined by half the difference between potentials Vdd and GND divided by the value of resistance R3. In this example where the amplitude A1 of pulses P1 is equal to twice the amplitude A3 of pulses P3, resistance R3 has a value twice greater than that of resistance R1.

In this example, circuit C5 is implemented as described in relation with FIG. 9, that is, by flip-flop 900.

In this example, circuit C6 is implemented as described in relation with FIG. 9. Circuit 910 is for example implemented by a comparator such as described in relation with FIG. 13 having its inverting input (− in FIG. 14, in1 in FIG. 13) receiving level ref, its non-inverting input (+ in FIG. 14, in2 in FIG. 13) receiving the output signal RES2 of circuit INT2, and its output supplying signal comp2.

In this example, circuit C7 is implemented as described in relation with FIG. 9.

In this example, circuit INTP is implemented as described in relation with FIG. 12, the inverting input − of the amplifier 1100 of circuit INTP receiving potential ref and the non-inverting input + of this amplifier 1100 receiving pulses P4. The switch 1200 of circuit INTP is for example controlled by signal CMD2 to be on during each pulse CMD2.

In this example, circuit INT2 is implemented as described in relation with FIG. 9. More particularly, circuit 908 is implemented as described in relation with FIG. 11, by an operational amplifier 1100 and a capacitive element C, the inverting input − of amplifier 1100 receiving signal ref, the non-inverting input + of amplifier 1100 receiving signal S, and the output of amplifier 1100 supplying signal RES2. Further, circuit 906 corresponds, in this example, to two resistors R5 and R6, of same value, each connected between a respective input of circuit 906 and the inverting input − of the amplifier 1100 of circuit 908, signal S being available on the inverter input − of amplifier 1100. Circuit 902 corresponds, in this example, to a switch IT5 connected between the output of circuit INT and an input of circuit 906. Switch IT5 is controlled by pulses CMD4 to only be on during pulses CMD4. Thus, signal RES1 is only supplied to the input of circuit 906 during each pulse CMD4. Similarly, in this example, circuit 904 corresponds to a switch IT6 connected between the output of circuit C7 and another input of circuit 906. Switch IT6 is controlled by pulses CMD4 to only be on during pulses CMD4. Thus, signal CR is only supplied to the input of circuit 906 during each pulse CMD4. As a result, the signal S corresponding to the sum of signals CR and RES1 is only supplied to the input of circuit 908, that is, to the inverting input − of the amplifier 1100 of this circuit 908, during each pulse CMD4.

In this example, circuit 915 or block +A4/−A4 comprises a switch IT4, an inverter 1402, and a resistor R4 in series between the output of circuit C6 and circuit INTP. Switch IT4 is controlled by signal CDM3 to only be on during pulses CMD3. Thus, each pulse CMD3 results in a pulse P4 supplied to circuit INTP, which has a negative level −A4 when bit OUT2 is in the high state and a positive level +A4 when bit OUT2 is in the low state. The amplitude A4 of pulses P4 is determined by half the difference between potentials Vdd and GND divided by the value of resistance R4. In this example where the amplitude A1 of pulses P1 is equal to twice the amplitude A4 of pulses P4, resistance R4 has a value twice greater than that of resistance R1.

In this example, signal RES2 increases, respectively decreases, when circuit 908 receives a negative, respectively positive, pulse S, signal comp2 is in the high, respectively low, binary state, when signal RES2 is greater, respectively smaller, than level ref, signal OUT2 is updated with the state of signal comp2 at each end of a pulse CMD4, and signal CR increases, respectively decreases, when the pulse P4 received by circuit INTP is negative, respectively positive. Thus, those skilled in the art will understand that, to implement the negative feedback in stage STAGE2 (not referenced in FIG. 14) according to the example of FIG. 14, pulses P4 should be negative when bit OUT2 is in the high binary state, and positive when bit OUT2 is in the low binary state. Those skilled in the art are capable of modifying the polarity of pulses P4 relatively to the binary state of bit OUT2 in the case where, as compared with the example of FIG. 14, signal RES2 increases, respectively decreases, when pulses S are positive, respectively negative, and/or signal comp2 is in the high, respectively low, binary state, when signal RES2 is smaller, respectively greater, than level ref, and/or OUT2 is updated with the binary state complementary to signal comp2 at each end of a pulse CMD4, and signal CR increases, respectively decreases, when pulses P4 are positive, respectively negative.

In this example, the circuit DER and the circuit 984 described in relation with FIG. 9 are partly one and the same, or, in other words, the output of the stage STAGE2 of the converter 1 of FIG. 14 corresponds to the two bits OUT2 and OUT2-1. More exactly, the circuit 922 of circuit DER and circuit 984 are implemented by a circuit 9224 configured to receive signals OUT, OUT2, and OUT2-1 and to supply signal TDCOUT, in this example as a complement to 2 over three bits TDCOUT0, TDCOUT1, and TDCOUT2. Circuit 9224 is a digital logic circuit, implemented based on combinatory logic gates, for example, based on XOR gates and/or on inverting gates and/or on AND gates and/or on an OR gate, etc. In FIG. 14, circuit 9224 is represented in the form of a block, its implementation being within the abilities of those skilled in the art.

In the detailed example of implementation illustrated by FIG. 14, circuit 9224 is for example configured to supply bits TDCOUT0, TDCOUT1, and TDCOUT2 based on bits OUT1, OUT2, and OUT2-1 according to the following Table 1. In this example, the binary state '1', respectively '0', of a bit corresponds to a high, respectively low, level, of this bit, and bit TDCOUT2 represents the sign of signal TDCOUT which corresponds to the concatenation of bits TDCOUT2, TDCOUT1, and TDCOUT0.

TABLE 1

| OUT1 | OUT2 | OUT2-1 | TDCOUT2 | TDCOUT1 | TDCOUT0 | Value of TDCOUT |
|---|---|---|---|---|---|---|
| '1' | '0' | '0' | '0' | '0' | '0' | 0 |
| '0' | '0' | '0' | '0' | '0' | '1' | 1 |
| '1' | '1' | '0' | '0' | '0' | '1' | 1 |
| '0' | '1' | '0' | '0' | '1' | '0' | 2 |
| '1' | '0' | '1' | '1' | '1' | '1' | −1 |
| '0' | '0' | '1' | '0' | '0' | '0' | 0 |
| '1' | '1' | '1' | '0' | '0' | '0' | 0 |
| '0' | '1' | '1' | '0' | '0' | '1' | 1 |

Like for the converter 1 of order 2 described in relation with FIG. 9, based on the descriptions made in relation with FIGS. 1 to 9, those skilled in the art will be capable of adapting the description made in relation with FIG. 14 to cases where:

the duration Dmax of pulses P1 is different from a period Tclk of signal clk and is, for example, equal to two periods Tclk of signal clk, and/or converter 1 is not implemented in an all digital phase-locked loop, and/or converter 1 is of order greater than 2.

Various embodiments and variants have been described. Those skilled in the art will understand that certain features of these various embodiments and variants may be combined, and other variants will occur to those skilled in the art.

In particular, those skilled in the art are capable of adapting the previously made description to the case where all the polarities of the pulses are inverted. More generally, those skilled in the art are capable of inverting the high and low states of any of the binary signals and/or of any of pulses CMD1, CMD2, CMD3, and CMD4 and/or the signs of pulses P1, P2, P3, and P4 by adapting the circuits which receive or supply these signals so that the functionalities implemented by these circuits remain those described in the present application.

Further, those skilled in the art will be capable of providing other examples of values for numbers K1, K2, K3, and K4 by adapting amplitudes A1, A2, A3, and A4 according to the dynamic range of converter 1.

Those skilled in the art will also be capable of providing other examples of implementation of the previously described circuits. For example, circuits C3 and C6 may each be implemented only by a D flip-flop having its Q output set to a first binary state, respectively a second binary state, if its D input is smaller, respectively greater, than level ref when its C input receives an edge to which this C input is sensitive, the flip-flop then simultaneously implementing a binary quantization and the storage of this quantization.

Finally, the practical implementation of the described embodiments and variations is within the abilities of those skilled in the art based on the functional indications given hereabove.

What is claimed is:

1. Time-to-digital converter comprising:
  a first circuit configured to supply, at each active edge of a first signal, a first pulse of duration determined by an interval between said active edge of the first signal and an immediately successive active edge of a second signal;
  an integrator circuit configured, at each first pulse, to integrate:
    the first pulse,
    a second pulse starting after the first pulse and in synchronism with a clock signal, and
    a third pulse starting after the second pulse and in synchronism with the clock signal;
  a second circuit configured to generate, for each first pulse, the corresponding second pulse;
  a third circuit configured to quantize over one bit an output signal of the integrator circuit and, at the beginning of each third pulse, store over a first bit said binary quantization; and
  a fourth circuit configured to generate, for each first pulse, the third corresponding pulse based on the first bit,
  wherein the second circuit is configured to receive the clock signal and to generate at least one third signal configured to control the storages by the third circuit and the generations of the third pulses by the fourth circuit, and
  wherein the first circuit is configured to supply a fourth signal indicating a beginning and an end of each first pulse, the second circuit being configured to receive the fourth signal and to generate the third signal based on the clock signal and based on the fourth signal.

2. Converter according to claim 1, wherein:
  the first and second circuits are configured so that the second pulses place a conversion zero of the converter in the middle of the dynamic range of the converter; and the fourth circuit is configured so that the integration of each third pulse implements a subtraction of the binary quantization stored at the beginning of said third pulse.

3. Converter according to claim 1, wherein:
the converter is of sigma-delta type;
the first and second circuits are configured so that each second pulse causes, on the output signal of the integrator circuit, a variation of identical amplitude and of a sign opposite to an amplitude variation that would be caused by a first pulse of duration determined by half the dynamic range of the converter; and
the fourth circuit is configured so that each third implements a negative sigma-delta feedback.

4. Converter according to claim 1, wherein:
the first, second, and third pulses are signed;
the first and second circuits are configured so that a sign of the second pulses is opposite to a sign of the first pulses and that a maximum duration of the first pulses that the converter can convert multiplied by an amplitude of the first pulses is equal to twice a duration of the second pulses multiplied by an amplitude of the second pulses; and
the fourth circuit is configured so that a sign of each third pulse is determined by a state of the first bit and that an amplitude of the third pulses multiplied by a duration of the third pulses is equal to the duration of the second pulses multiplied by the amplitude of the second pulses.

5. Converter according to claim 1, wherein the second and third pulses each have a duration which is a multiple of a period of the clock signal, preferably equal to one period of the clock signal.

6. Converter according to claim 1, where an output of said converter is at least partly determined by the first bit.

7. Converter according to claim 1, wherein the converter is of sigma-delta multi-stage noise shaping type, the converter comprising a first stage comprising the integrator circuit and the first, second, third, and fourth circuits, and a second stage configured to receive an output signal of the integrator circuit of the first stage and to supply a digital output signal of the second stage based on the output signal of the integrator circuit of the first stage, an output of said converter being at least partly determined by the first bit and the output digital signal of the second stage.

8. Converter according to claim 7, wherein the second stage is configured to:
generate, after each third pulse, a fourth pulse starting in synchronism with the clock signal;
integrate, during each fourth pulse, a sum of the output signal of the integrator circuit of the first stage and of a feedback signal, quantize over one bit a result of said integration and store over a second bit said binary quantization at the end of the fourth pulse;
generate, during each third pulse, a fifth pulse from based on the second bit, and the feedback signal by integrating said fifth pulse; and
store the second bit over a third bit at each active edge of the first signal, the digital output signal of the second stage being generated based on the second and third bits or corresponding to the second and third bits.

9. Converter according to claim 7, wherein the second stage comprises:
a fifth circuit configured to generate, after each third pulse, a fourth pulse starting in synchronism with the clock signal;
an integrator circuit configured to integrate, during each fourth pulse, a sum of the output signal of the integrator circuit of the first stage and of a feedback signal;
a sixth circuit configured to quantize over one bit an output of the integrator circuit of the second stage and to store said binary quantization over a second bit, at the end of each fourth pulse;
a seventh circuit configured, at each third pulse, to supply said feedback signal by integrating, during said third pulse, a fifth pulse determined based on the second bit; and
a circuit configured to store the second bit over a third bit at each active edge of the first signal, the digital output signal of the second stage being generated based on the second and third bits or corresponding to the second and third bits.

10. Converter according to claim 1, wherein the converter comprises a first input configured to receive the first signal and a second input configured to receive the clock signal, and wherein:
the second signal and the clock signal are one and the same, or
the converter comprises a circuit for dividing the frequency, preferably by two, configured to receive the clock signal and to supply the second signal.

11. All digital phase locked loop configured to receive a signal at a first frequency and to supply a signal at a second frequency equal to N/D times the first frequency, N and D being two positive values, the phase-locked loop comprising a converter according to claim 10, the first input of the converter being configured to receive the signal at the first frequency and the second input of the converter being configured to receive the signal at the second frequency.

12. Phase-locked loop according to claim 11 comprising:
a circuit configured to supply a first digital signal incremented by value N at the first frequency;
a circuit configured to supply a second digital signal incremented by value D at the second frequency and a third digital signal corresponding to a storage of the second digital signal clocked at the first frequency;
a digital filter configured to receive a subtraction of an output of the converter and of the third digital signal to the first digital signal and to control an oscillator configured to supply the signal at the second frequency, wherein the second signal of the converter is on and the same with the signal at the second frequency.

13. Phase-locked loop according to claim 11 comprising either a circuit configured to supply a first digital signal incremented by value N at the first frequency, and a circuit configured to supply a second digital signal incremented by value D/2 at the second frequency, D being even, or a circuit configured to supply a first digital signal incremented by value 2N at the first frequency and a circuit configured to supply a second digital signal incremented by value D at the second frequency;
a circuit configured to supply a third digital signal corresponding to a storage of the second digital signal clocked by the second signal of the converter;
a digital filter configured to receive a subtraction of an output of the converter and of the third digital signal to the first digital signal and to control an oscillator configured to supply the signal at the second frequency, wherein the second signal of the converter is obtained by dividing by two the frequency of the signal at the second frequency.

* * * * *